United States Patent
Kumagai et al.

(10) Patent No.: US 6,535,364 B1
(45) Date of Patent: Mar. 18, 2003

(54) MAGNETIC RESISTANCE ELEMENT HAVING FOUR MAGNETIZATION STATES AND A MAGNETIC DEVICE USING THE SAME

(75) Inventors: Seiji Kumagai, Miyagi (JP); Yoshito Ikeda, Tochigi (JP); Terunobu Miyazaki, Miyagi (JP); Yoshiyuki Fukumoto, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/482,914

(22) Filed: Jan. 14, 2000

(30) Foreign Application Priority Data

Jan. 18, 1999 (JP) ............................................. 11-009892

(51) Int. Cl.[7] .................................................. G11B 5/39
(52) U.S. Cl. ..................................... 360/324.2; 365/158
(58) Field of Search ............................... 360/324.2, 126, 360/314; 365/171, 158; 257/108, 421; 324/252

(56) References Cited

U.S. PATENT DOCUMENTS

| | | | | |
|---|---|---|---|---|
| 5,757,056 A | * | 5/1998 | Chui | 257/108 |
| 5,862,022 A | * | 1/1999 | Noguchi et al. | 257/421 |
| 5,930,164 A | * | 7/1999 | Zhu | 365/158 |
| 5,991,193 A | * | 11/1999 | Gallagher et al. | 365/171 |
| 6,124,711 A | * | 9/2000 | Tanaka et al. | 257/421 |
| 6,275,363 B1 | * | 8/2001 | Gill | 360/324.2 |
| 2002/0044396 A1 | * | 4/2002 | Amano et al. | 360/324.2 |

FOREIGN PATENT DOCUMENTS

| | | | |
|---|---|---|---|
| EP | 001085586 A2 | * | 3/2001 |
| JP | 2001144345 A | * | 5/2001 |
| WO | WO 0059051 | * | 10/2000 |

* cited by examiner

Primary Examiner—Hoa T. Nguyen
Assistant Examiner—Tianjie Chen
(74) Attorney, Agent, or Firm—Sonnenschein, Nath & Rosenthal

(57) ABSTRACT

A magnetic resistance element is provided that includes an upper magnetic layer, which is formed in contact with an anti-ferromagnetic layer, and at least two magnetic layers that are layered with tunnel barrier wall layers respectively inserted between the first magnetic layer and each of the at least two magnetic layers such that the magnetic resistance element has a combined resistance that corresponds to one of four predefined magnetic resistances and that can be changed to another of the four predefined magnetic resistances by applying a predefined recording magnetic field pattern to the magnetic resistance element.

31 Claims, 31 Drawing Sheets

MAGNETIC RESISTANCE ELEMENT HAVING FOUR MAGNETIZATION STATES AND A MAGNETIC DEVICE USING THE SAME

RELATED APPLICATION DATA

The present application claims priority to Japanese Application No. P11-009892 filed Jan. 18, 1999, which application is incorporated herein by reference to the extent permitted by law.

BACKGROUND OF THE INVENTION

The present invention relates to a magnetic resistance element using a magnetic tunneling effect and also to a novel magnetic device using the magnetic resistance element.

There has been a report of a magnetic tunneling effect in which the conductance of a tunnel current flowing through a thin insulating layer depends on a relative angle of magnetization of both magnetic layers in a three-layer structure consisting of magnetic metal, an insulating layer, and magnetic metal.

In this phenomenon, the magnetic resistance ratio can be logically calculated by polarizabilities of both magnetic layers. For example, in case of using Fe for both magnetic layers, an MR ratio of about 40% can be expected.

Further, in recent years, there have successively been reports teaching that a large MR ratio is realized at a room temperature, which have attracted a great attention as a new device.

Meanwhile, a change of resistance is achieved by making two magnetic layers parallel with other or anti-parallel with each other in a magnetic tunneling element which had appeared before. Mainly used as methods for realizing this are a method of making a difference in coercive force between two magnetic layers and a method of approximating an anti-ferromagnetic layer to a magnetic layer thereby to pin motion of magnetization.

However, in these methods, the resistance transits between a case of high resistance in a state in which directions of magnetization are aligned in parallel with each other and a case of low resistance in a state in which the directions are aligned in anti-parallel with each other, so that no stable state exists halfway. Therefore, these methods are disadvantageous when multivaluing the memory.

BRIEF SUMMARY OF THE INVENTION

The present invention has been proposed in consideration of the conventional situation as described above and has an object of providing a magnetic resistance element capable of realizing a more excellent magnetization array condition than a conventional element, and further an object of providing a magnetic device using the same.

To achieve the above object, in a magnetic resistance element according to the present invention, a first magnetic layer, which is formed in contact with an anti-ferromagnetic layer, and at least two magnetic layers are layered such that tunnel barrier wall layers are respectively inserted between the first magnetic layer and the at least two magnetic layers.

For example, if the at least two magnetic layers are formed of second and third magnetic layers, four kinds of magnetization array states exist.

The magnetic resistance element described above is applicable to various magnetic devices such as a magnetic memory, a magnetic head, and the like.

As is apparent from the above explanation, according to the present invention, it is possible to realize a magnetic resistance element having four or more kinds of magnetization array states in case where no external magnetic field exists.

In this magnetic resistance element, the magnetization array states are controlled by an external magnetic field and each state can be selected freely. Further, by applying a sense magnetic field of a specific pattern, it is possible to detect which magnetization array state is selected.

Accordingly, multivalued recording can be achieved by utilizing the magnetic resistance element for a magnetic memory and a magnetic head, the recordable information amount can be remarkably increased.

DETAILED DESCRIPTION OF THE INVENTION

In the following, the magnetic resistance element and the magnetic device according to the present invention will be explained with reference to the drawings.

Figure 1:
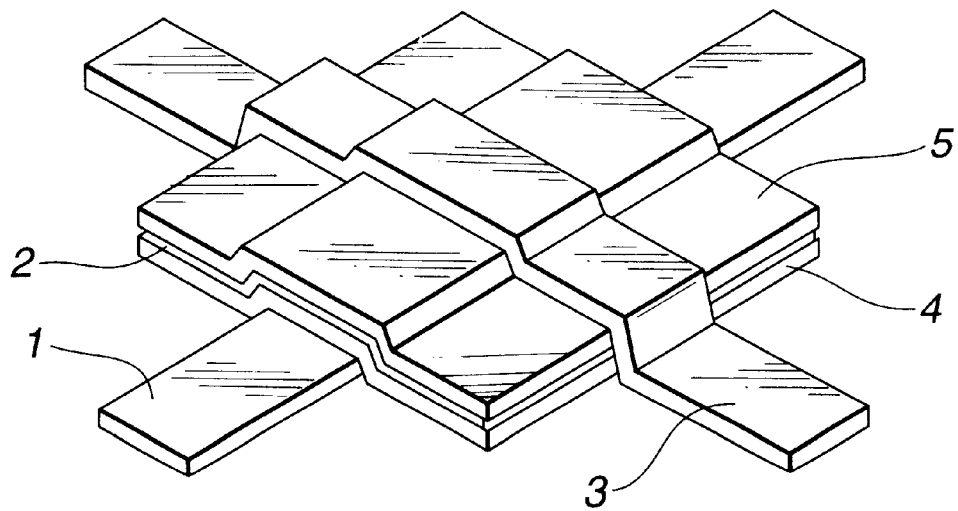
FIG. 1 is a schematic perspective view showing a structural example of a magnetic resistance element to which the present invention is applied.
Figure 2:
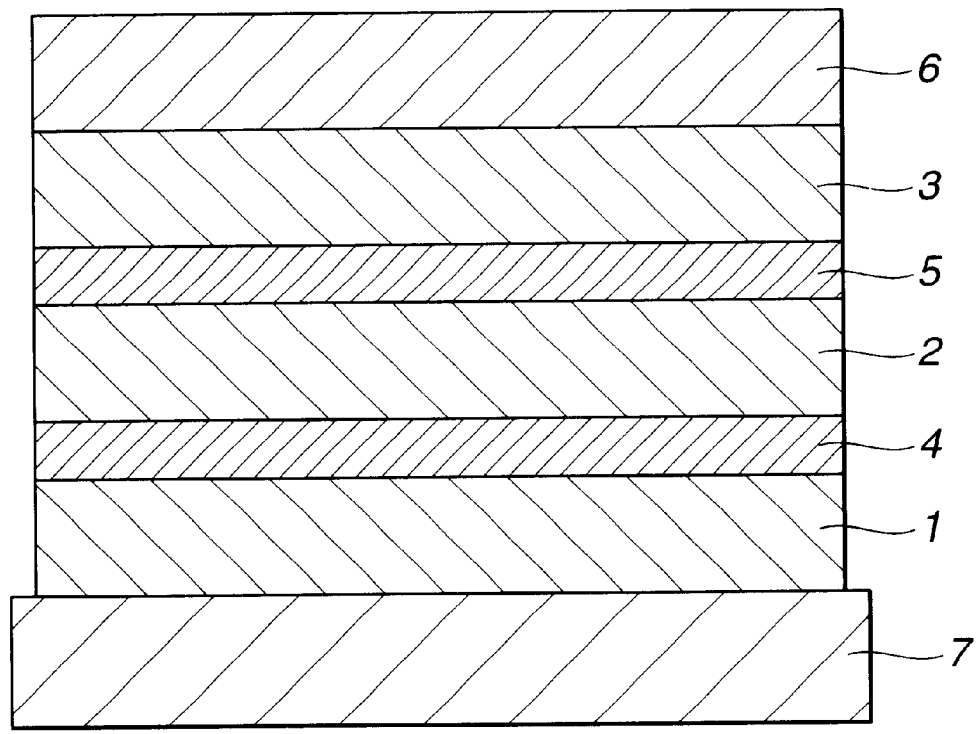
FIG. 2 is a schematic cross-sectional view of the magnetic resistance element shown in FIG. 1.

As shown in FIGS. 1 and 2, the magnetic resistance element comprises three layers of a lower magnetic layer 1, an intermediate layer 2, and an upper magnetic layer 3, and is also structured such that tunnel barrier wall layers 4 and 5 are formed between the lower magnetic layer 1 and the intermediate magnetic layer 2 and between the intermediate magnetic layer 2 and the upper magnetic layer 3.

Also, an anti-ferromagnetic layer 6 (which is omitted from FIG. 1) is formed in contact with the upper magnetic layer 3. This anti-ferromagnetic layer 6 serves to pin the direction of magnetization of the upper magnetic layer 3 in one direction.

The magnetic resistance element having the layer structure as described above is formed on a substrate 7.

In the structure described above, although each of the magnetic layers 1, 2, and 3 is formed of a magnetic material, only the interfaces of these layers may be formed of the magnetic material while metal such as Au, Cu, Al, Pt, or the like may be used for the other portions thereof.

The tunnel barrier wall layers 4 and 5 are made of oxidized Al films and the films are very thin.

The tunnel barrier wall layers 4 and 5 may be made of a material other than oxidized Al, and for example, Gd, Hf, Fe, Co, Ni, Se, Mg, or the like may be used in place of Al. Further, any metal can be used as long as the metal can be oxidized to form a tunnel wall.

Although plasma oxidation may be cited as a method of oxidizing the metal, it is possible to use other oxidation than the plasma oxidation, e.g., natural oxidation, oxidation by introducing oxygen into the vacuum chamber, or the like.

Otherwise, the tunnel barrier wall layers may be formed by directly forming films from insulating material such as $Al_2O_3$, $SiO_2$, Al nitride, Si nitride, diamond-like carbon (DLC), or the like.

Film formation of each layer may be of any arbitrary method such as a spattering method, evaporation, or the like.

Although a metal mask is used for patterning of each layer, patterning may be performed by another method such as photolithography, electron beam lithography, or the like.

In addition, an Si substrate may be used for the substrate, another material such as an AlTiC-based material, TiO—CaO-based, or the like may be used.

As for the shape, the element is constructed as opposite electrodes having a cross-like shape like crossed opposite electrodes in this case. However, the element may be constructed in any arbitrary shape in accordance with the purpose of use as long as the layer structure consisting of a magnetic layer, a tunnel barrier wall layer, a magnetic layer, a tunnel barrier wall layer, and an anti-ferromagnetic layer is satisfied. The contact area of the element may be arranged arbitrarily.

Further, if the characteristics can be improved by a thermal treatment such as annealing in a magnetic field, such post processing may be arbitrarily performed in each embodiment of the present invention.

In the magnetic resistance element constructed in the structure described above, the coercive forces of the lower magnetic layer 1, the intermediate layer 2, and the upper magnetic layer 3 are expressed as Hc1, Hc2, and Hc3. In this embodiment, Hc1<Hc2.

Also, the resistance change caused between the lower magnetic layer 1 and the intermediate magnetic layer 2 is expressed as δR1, and the resistance change caused between the intermediate magnetic layer 2 and the upper magnetic layer 3 is expressed as δR2. In this embodiment, δR1>δR2.

Further, the shift magnetic field of the upper magnetic layer 3 depending on the anti-ferromagnetic layer 6 is expressed as Hs.

Figure 3:
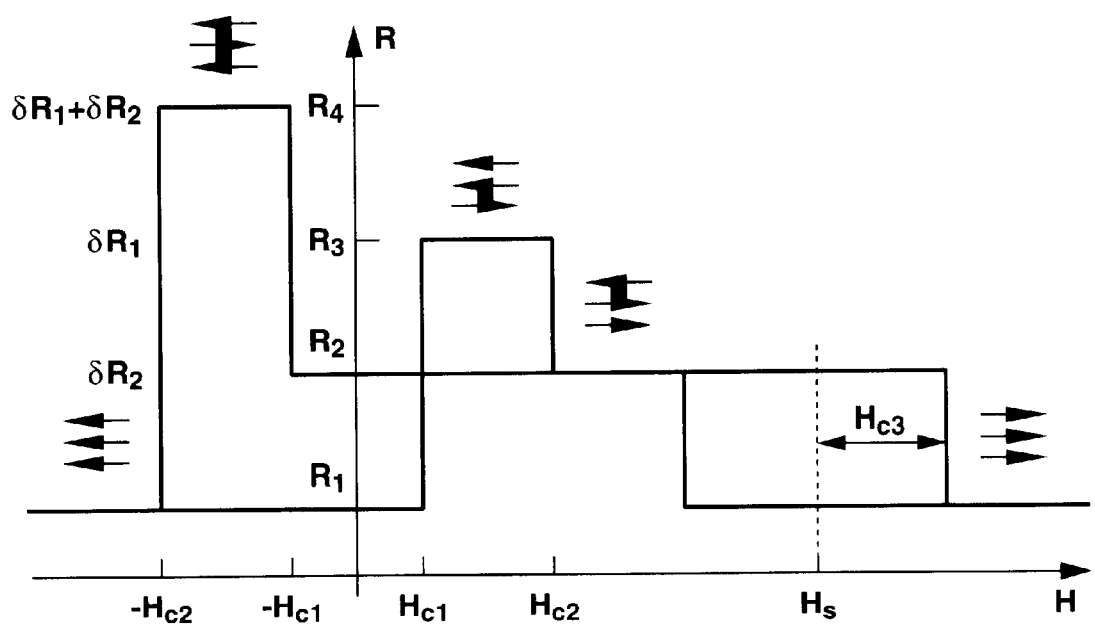
FIG. 3 is a schematic view showing a magnetic resistance curve in case where $Hc1<Hc2$ and $\delta R1>\delta R2$ exist.
Figure 4:
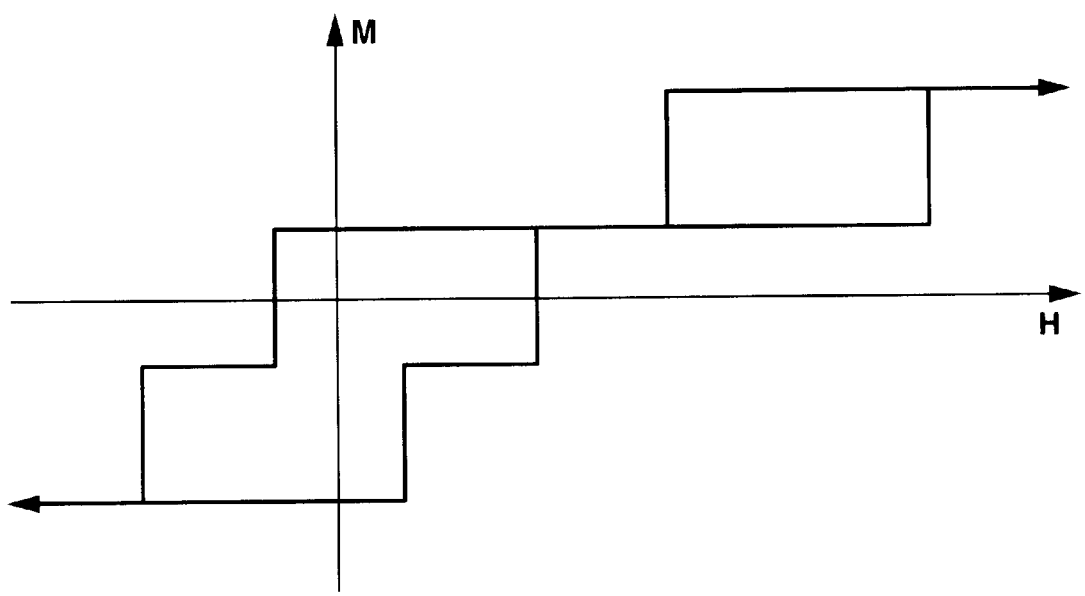
FIG. 4 is a schematic view showing a magnetization curve in case where $Hc1<Hc2$ and $\delta R1>\delta R2$ exist.

FIG. 3 schematically shows a model of a magnetic resistance curve of the magnetic resistance element in the setting as described above. FIG. 4 also schematically showing a model of a magnetization curve.

In this embodiment where Hc1<Hc2 and δR1>δR2 are satisfied, magnetization of all the three layers is directed to the left and aligned when the magnetic field is set to −Hc2 or less (e.g., where three arrows in each figure express the lower magnetic layer 1, the intermediate layer 2, and the upper magnetic layer 3 in that order from bottom to top). In this case, the resistance of the magnetic resistance element (i.e., the combined resistance) is R1.

If the magnetic field is changed to the positive direction, the magnetization is inverted when the magnitude of the external magnetic field becomes Hc1, and the resistance is increased by R1 to become R3 (=R1+δR1).

If the magnetic field is further changed to the positive side, the direction of the magnetization of the intermediate magnetic layer 2 is inverted and the resistance becomes R2 (=R1+δR2).

If the magnetic field is further changed to the positive side to become Hs+Hc3 or more, the magnetization arrays are all aligned to the right and return to R1 again.

If the magnetic field is further changed to the negative side from this state, the direction of the upper magnetic layer 3 is inverted at Hs−Hc3 so that the resistance value becomes R2. If the magnetic field is further changed to become −Hc1, the direction of the lower magnetic layer 1 is inverted so that the resistance becomes R4 (=R1+δR1+δR2).

When the magnetic field exceeds −Hc2, all the magnetization directions are aligned in the left direction, as in the initial state, and the resistance becomes R1.

The element which shows this change of the magnetization resistance indicates four kinds of resistance values in a state in which the magnetic field is zero by performing recording as shown in FIGS. 5 to 8.

Figure 5:
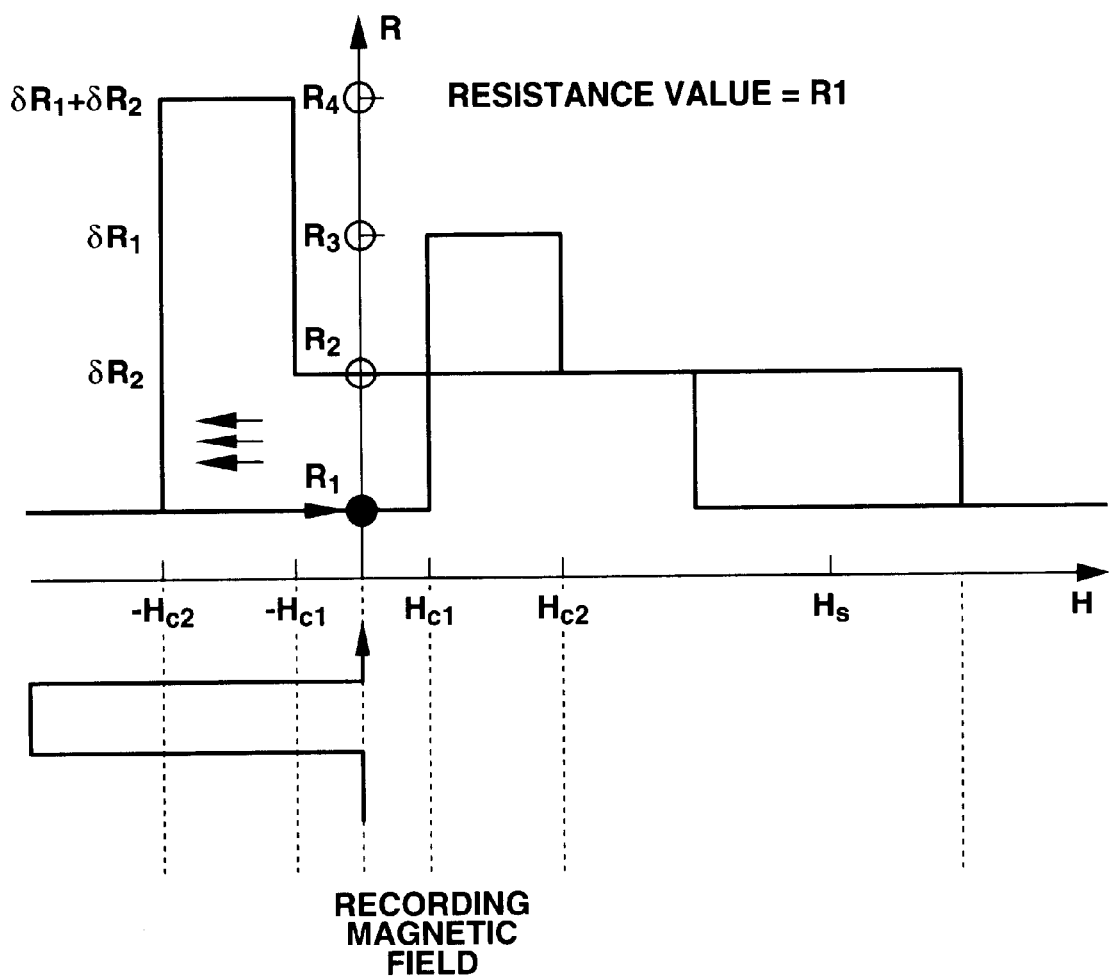
FIG. 5 is a schematic view showing a recording magnetic field for recording R1 in case where $Hc1<Hc2$ and $\delta R1>\delta R2$ exist.

In the implementation shown in FIG. 5 the applied magnetic field (or predefined recording magnetic field pattern) is changed from 0 to −(Hc2+α) to 0. In this case, the magnetization directions of the lower magnetic layer 1, the intermediate magnetic layer 2, and the upper magnetic layer 3 are aligned in the leftward direction, and the resistance value becomes R1.

Figure 6:
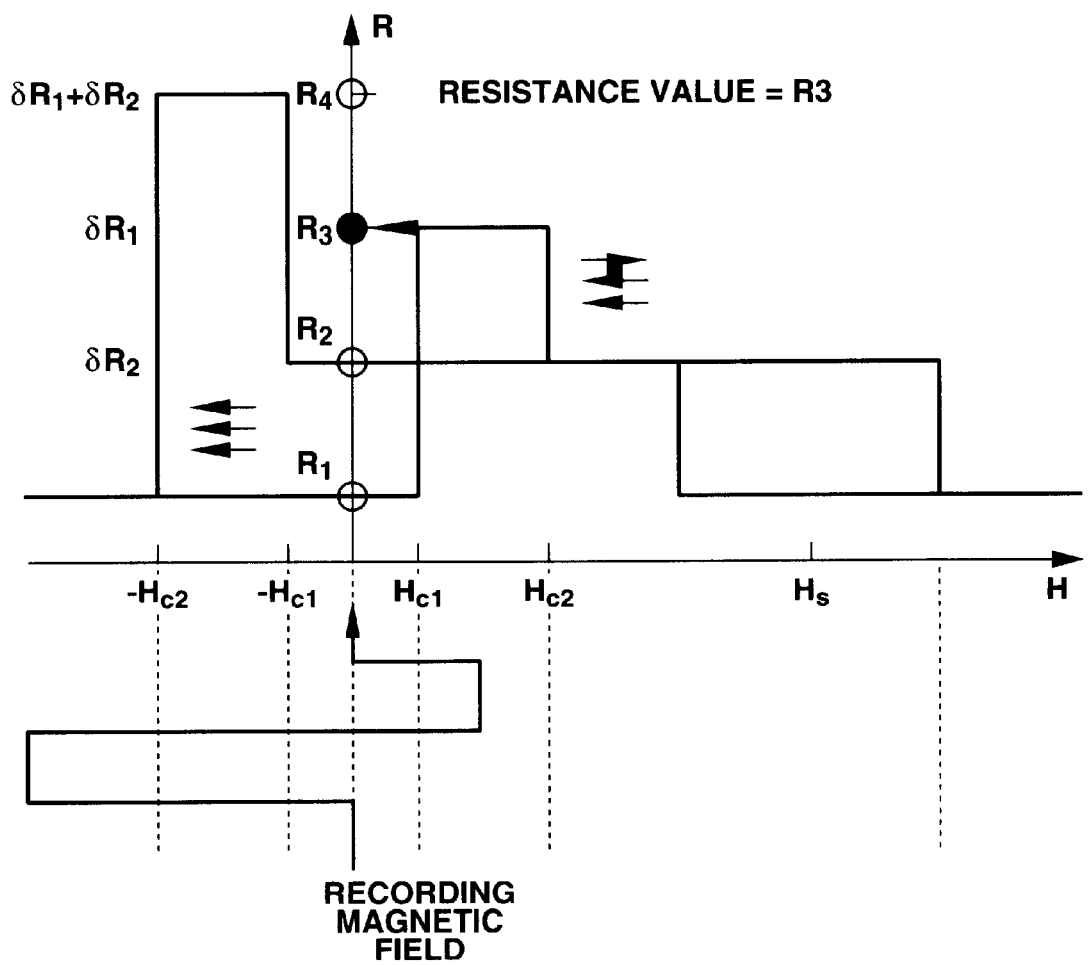
FIG. 6 is a schematic view showing a recording magnetic field for recording R3 in case where $Hc1<Hc2$ and $\delta R1>R2$ exist.

In the implementation shown in FIG. 6 the applied magnetic field (or predefined recording magnetic field pattern) is changed from 0 to −(Hc2+α) to Hc1+α(<Hc2) to 0, and the resistance value becomes R3.

Figure 7:
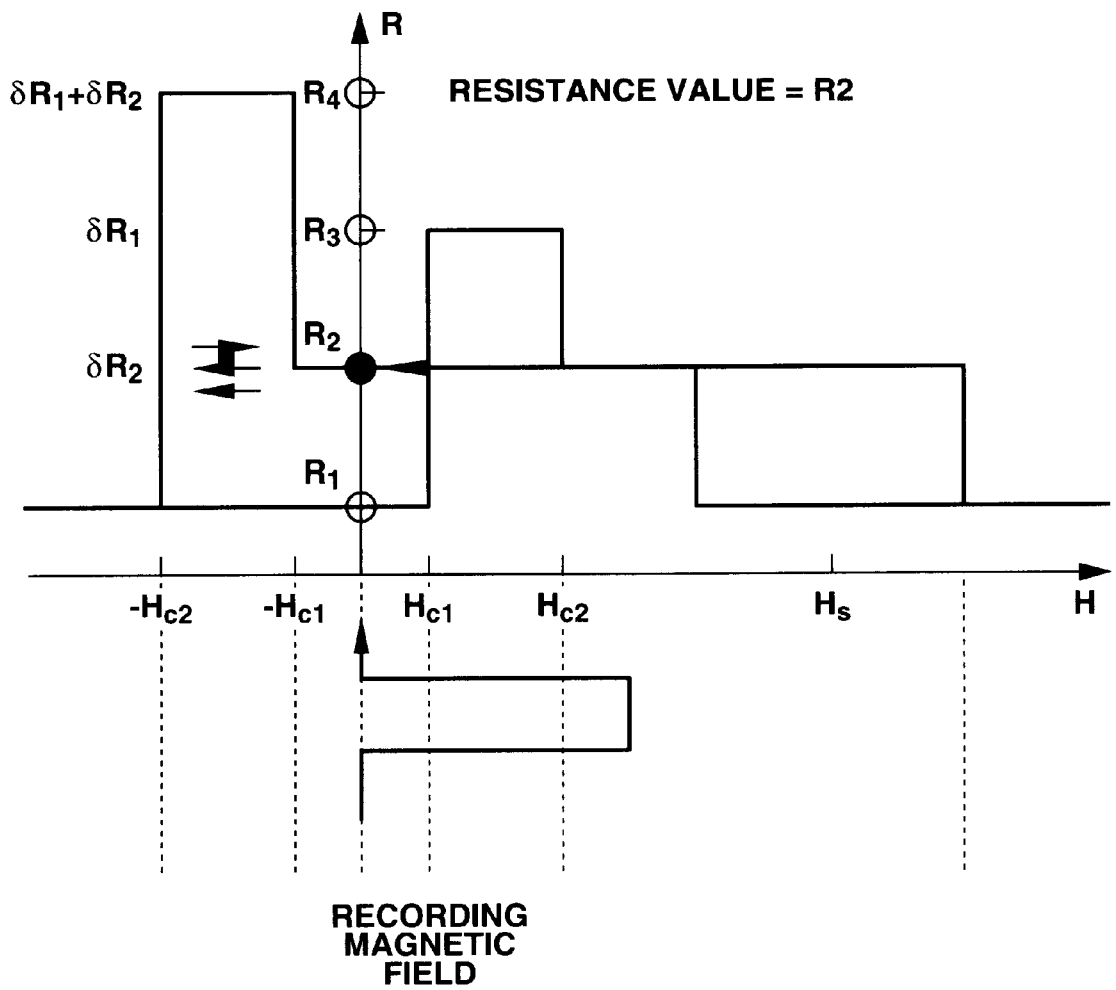
FIG. 7 is a schematic view showing a recording magnetic field for recording R2 in case where $Hc1<Hc2$ and $\delta R1>\delta R2$ exist.

In the implementation shown in FIG. 7 the applied magnetic field (or predefined recording magnetic field pattern) is changed from 0 to Hc2+α to 0, and the resistance value becomes R2.

Figure 8:
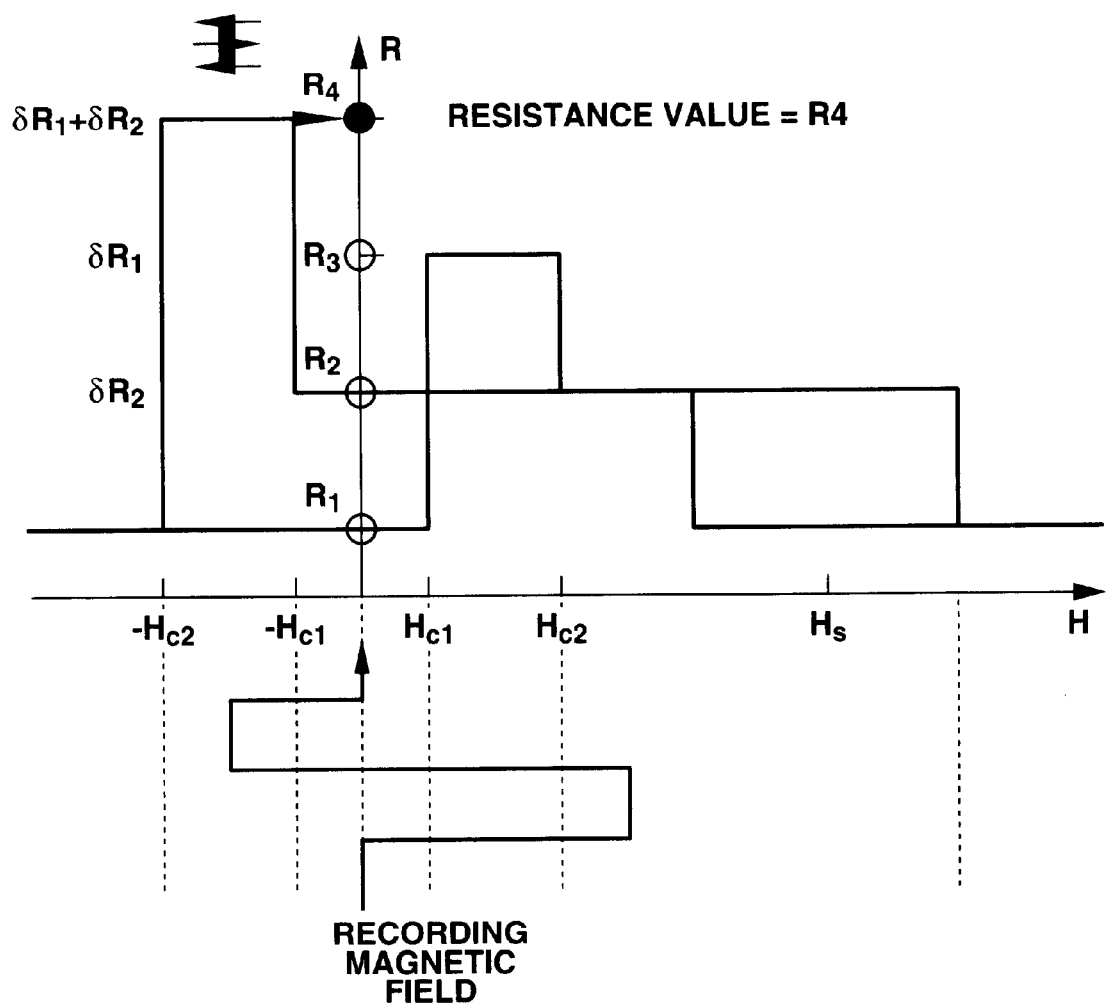
FIG. 8 is a schematic view showing a recording magnetic field for recording R4 in case where $Hc1<Hc2$ and $\delta R1>\delta R2$ exist.

In the implementation shown in FIG. 8 the applied magnetic field (or predefined recording magnetic field pattern) is changed from 0 to Hc2+α to −(Hc1+α) (>−Hc2) to 0, and the resistance value becomes R4.

Figure 9:
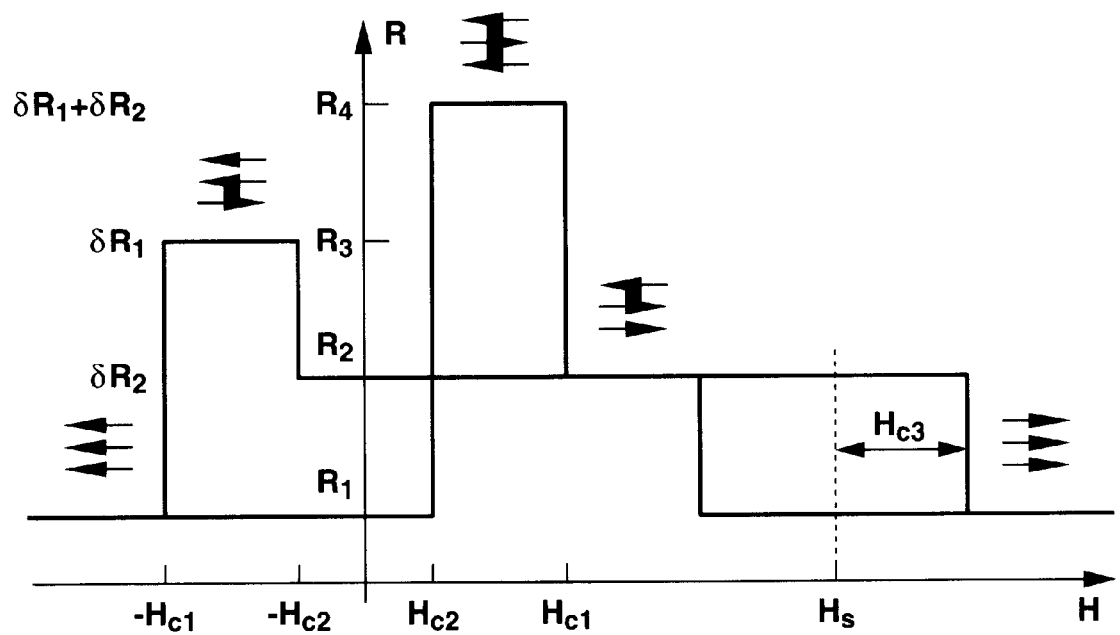
FIG. 9 is a schematic view showing a magnetic resistance curve in case where $Hc1>Hc2$ and $\delta R1>\delta R2$ exist.
Figure 10:
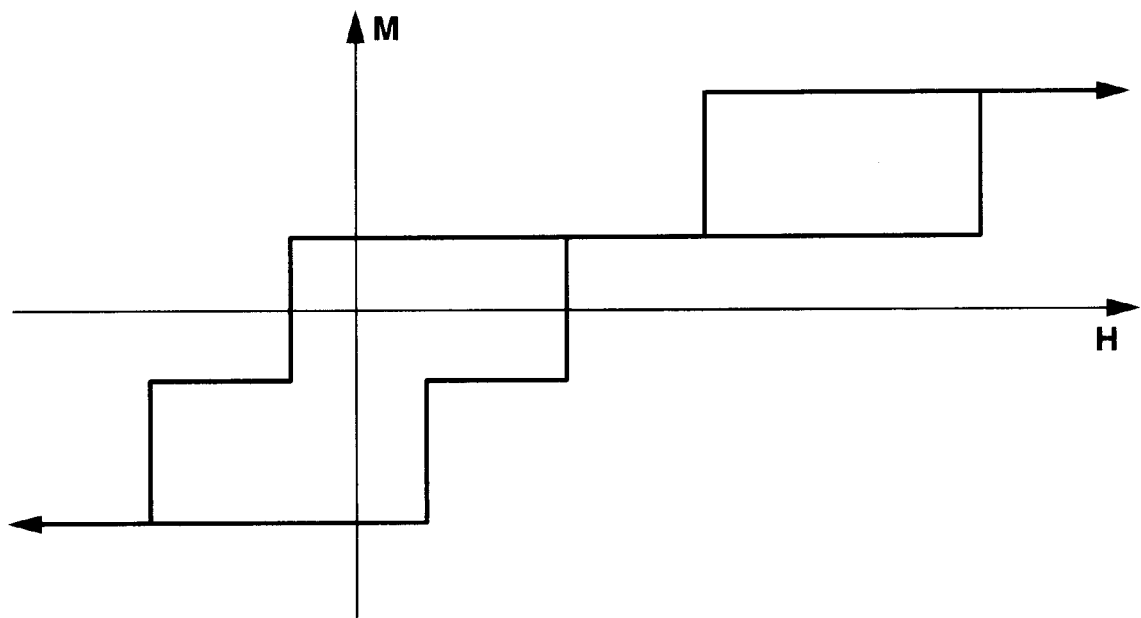
FIG. 10 is a schematic view showing a magnetization curve in case where $Hc1>Hc2$ and $\delta R1>\delta R2$ exist.
Figure 15:
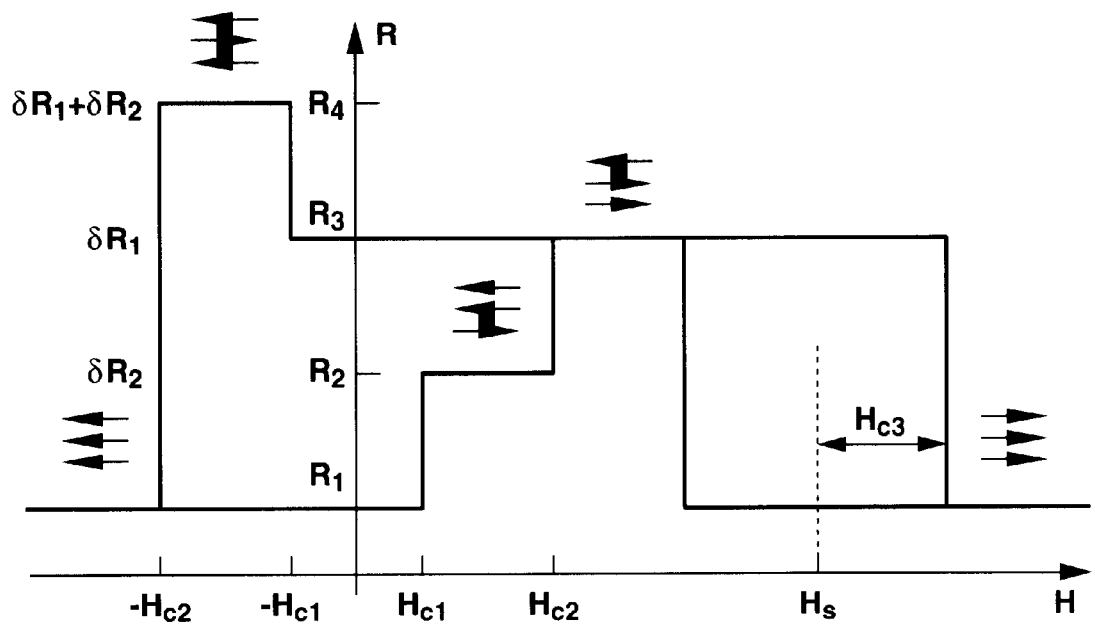
FIG. 15 is a schematic view showing a magnetic resistance curve in case where $Hc1<Hc2$ and $\delta R1<\delta R2$ exist.
Figure 21:
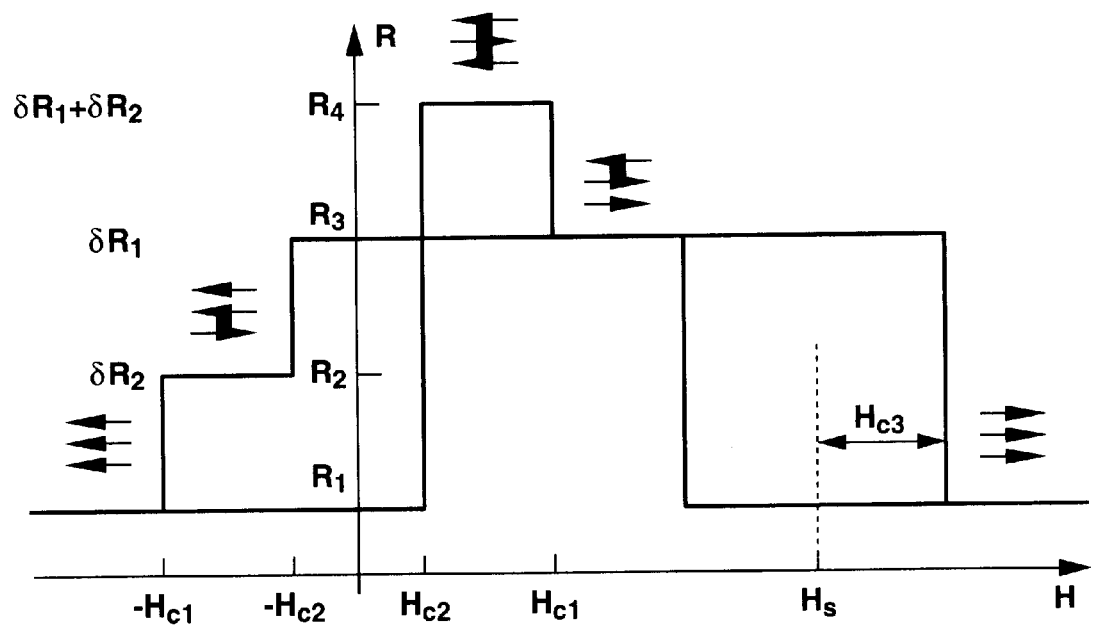
FIG. 21 is a schematic view showing a magnetic resistance curve in case where Hc1<Hc2 and δR1<δR2 exist.

Likewise, the implementations shown in FIGS. 9, 15, and 21 may be generated based on the relationship between magnitudes of Hc1 and Hc2 and the relationship between magnitudes of δR1 and δR2.

FIG. 9 schematically shows another model of the magnetic resistance curve of another embodiment of a magnetic resistance element embodying aspects of the present invention where Hc1>Hc2 and δR1 and δR2.

If the magnetic field is set to −Hc1 or less in the case 2, the magnetization directions of three layers are oriented and aligned in the leftward direction. In this case, the resistance is R1.

Next, when the magnetic field is gradually changed in the positive direction and the magnitude of the external magnetic field becomes Hc2, the magnetization of the intermediate layer 2 is inverted, and the resistance is increased by δR1+δR2 to become R4 (=R1+δR1+δR2).

If the magnetic field is changed to the positive side to become Hc1, the direction of the magnetization of the lower magnetic layer 1 is also inverted, and the resistance is decreased by δR1 to become R2 (=R1+δR2).

If the magnetic field is further changed to the positive side to become Hs+Hc3 or more, the magnetization arrays are aligned in the rightward direction, and return to R1 again.

If the magnetic field is changed to the negative side from this state, the direction of magnetization of the upper magnetic layer 3 is inverted at Hs−Hc3 and the resistance value becomes R2. If the magnetic field is further changed to become −Hc2, the direction of magnetization of the intermediate magnetic layer 2 is inverted and the resistance becomes R3 (=R1+δR1).

If the magnetic field exceeds −Hc1, all the magnetization directions are aligned in the leftward direction, as in the initial state, and the resistance becomes R1.

In the element (in the case 2) which shows this magnetic resistance change, four kinds of resistance values are indicated in the state where the magnetic field is zero, by performing recording as shown in FIGS. 11 to 14.

Figure 11:
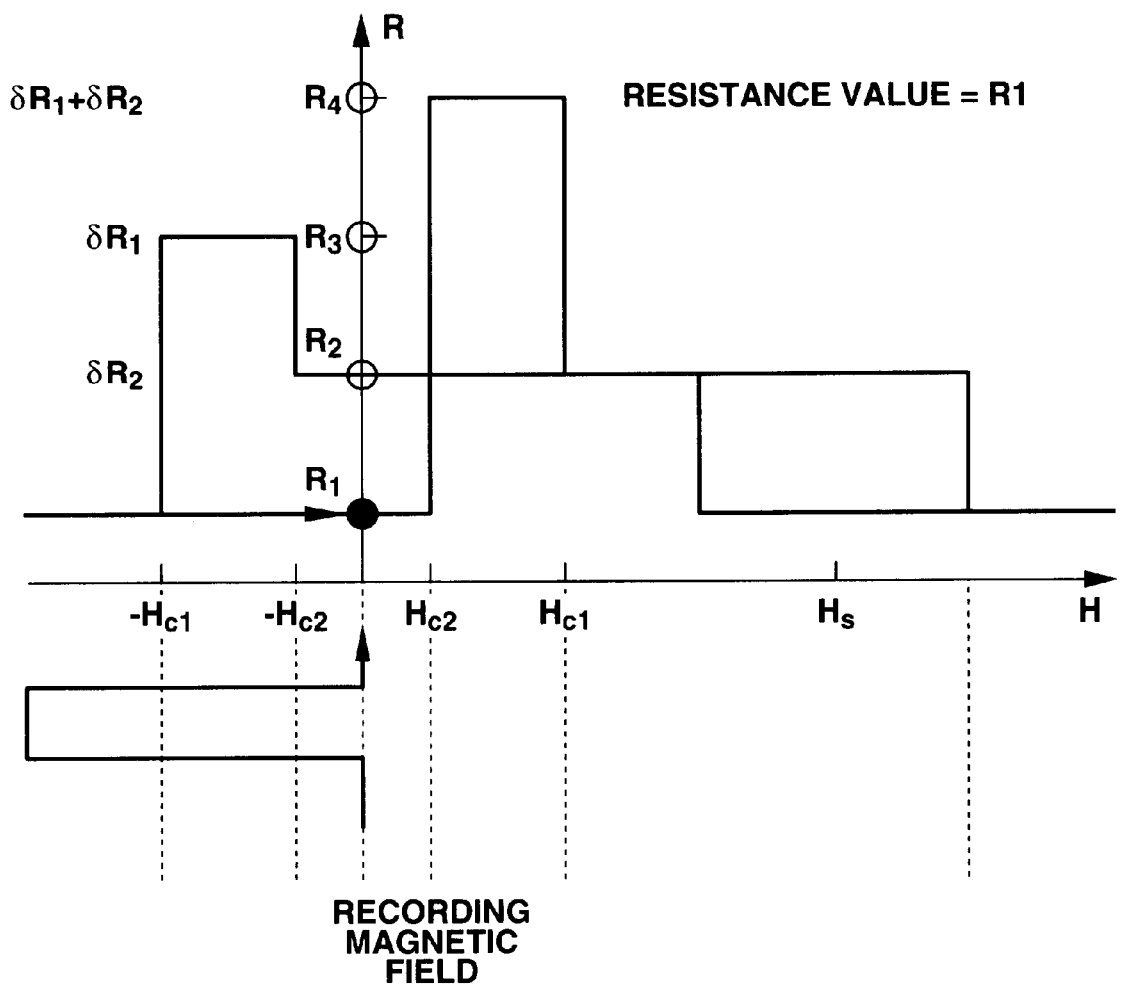
FIG. 11 is a schematic view showing a recording magnetic field for recording R1 in case where $Hc1>Hc2$ and $\delta R1>\delta R2$ exist.

In the implementation shown in FIG. 11 the applied magnetic field (or predefined recording magnetic field pattern) is changed from 0 to −(Hc1+α) to 0. In this case, the magnetization directions of the lower magnetic layer 1, the intermediate magnetic layer 2, and the upper magnetic layer 3 are aligned in the leftward direction, and the resistance value (i.e., the combined resistance value of the magnetic resistance element) becomes R1.

Figure 12:
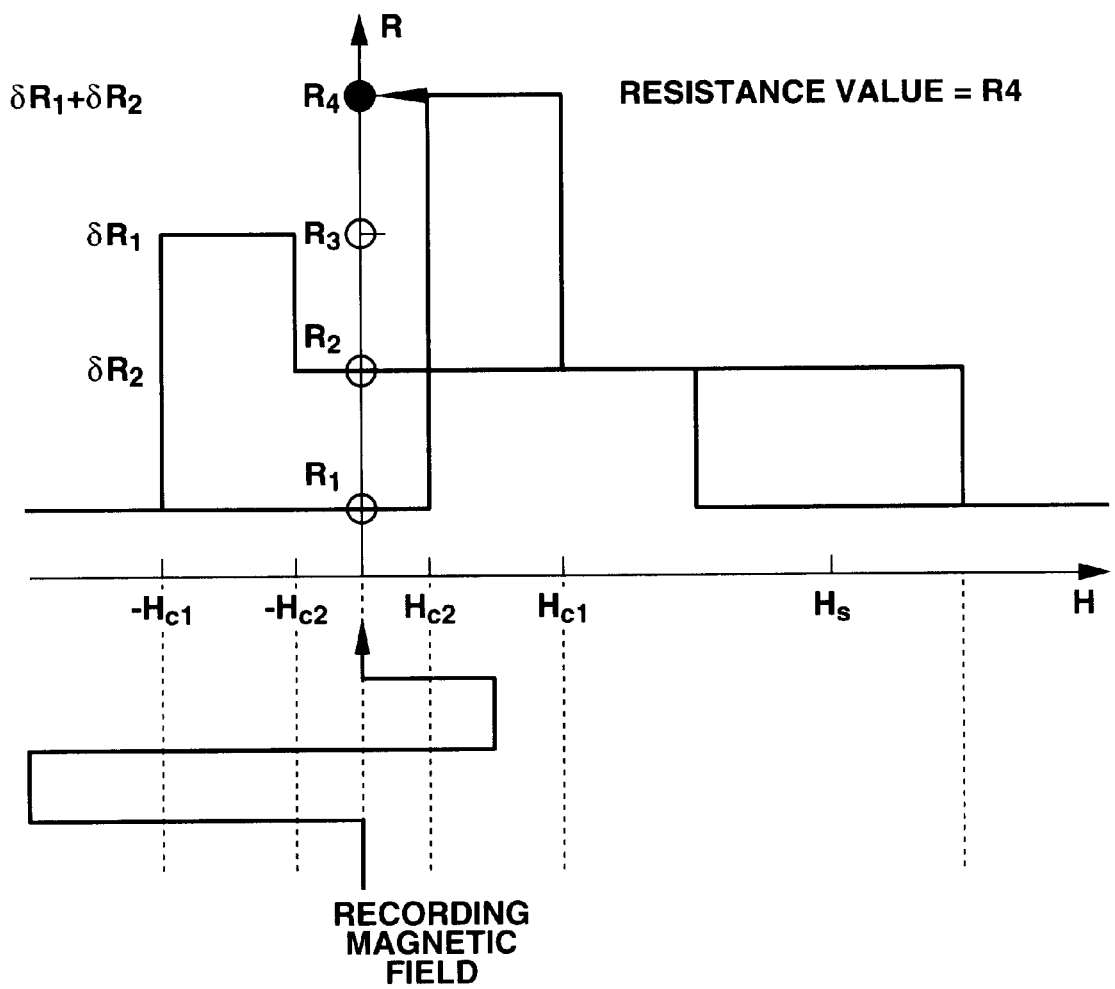
FIG. 12 is a schematic view showing a recording magnetic field for recording R4 in case where $Hc1>Hc2$ and $\delta R1>\delta R2$ exist.

In the implementation shown in FIG. 12, the applied magnetic field (or predefined recording magnetic field pattern) is changed from 0 to −(Hc1+α) to Hc2+α(<Hc1) to 0, and the resistance value becomes R4.

Figure 13:
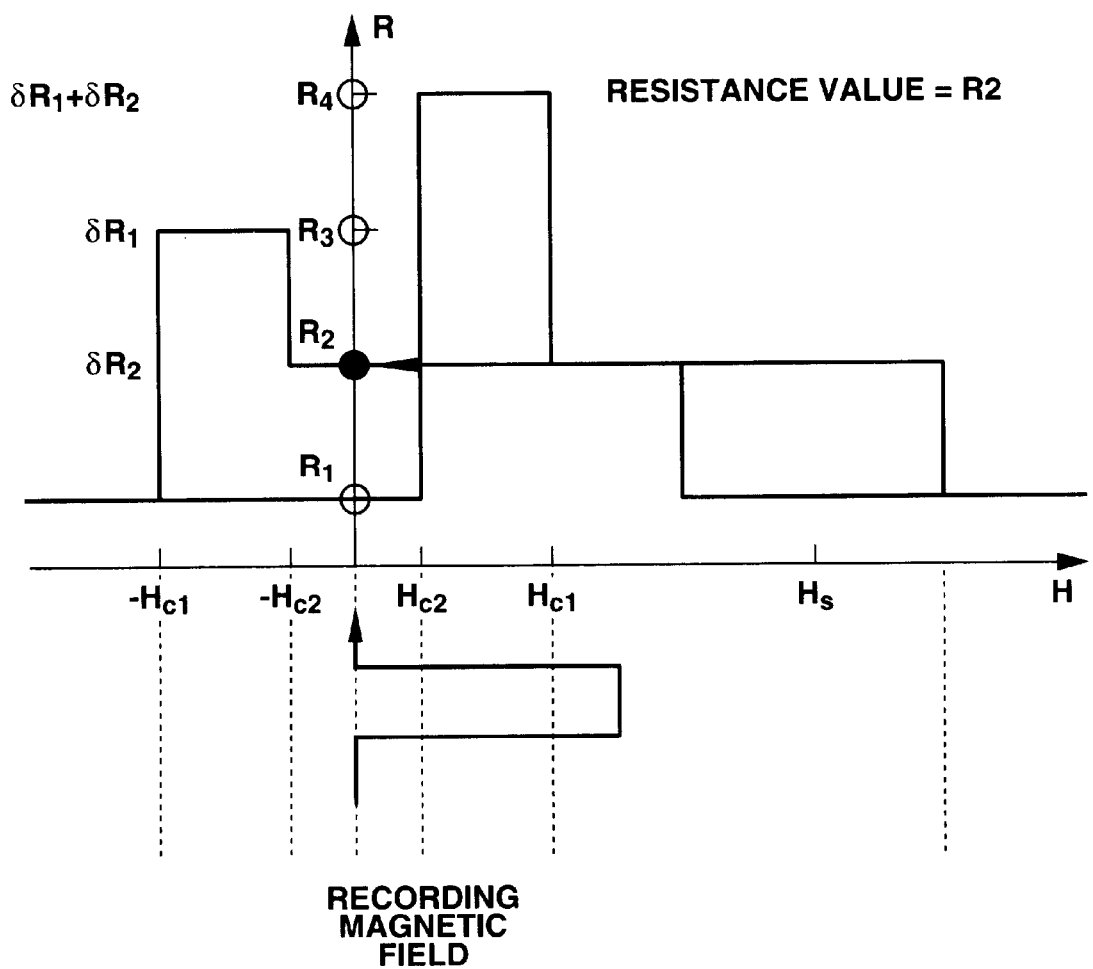
FIG. 13 is a schematic view showing a recording magnetic field for recording R2 in case where $Hc1>Hc2$ and $\delta R1>\delta R2$ exist.

In the implementation shown in FIG. 13, the applied magnetic field (or predefined recording magnetic field pattern) is changed from 0 to Hc1+α to 0, and the resistance value becomes R2.

Figure 14:
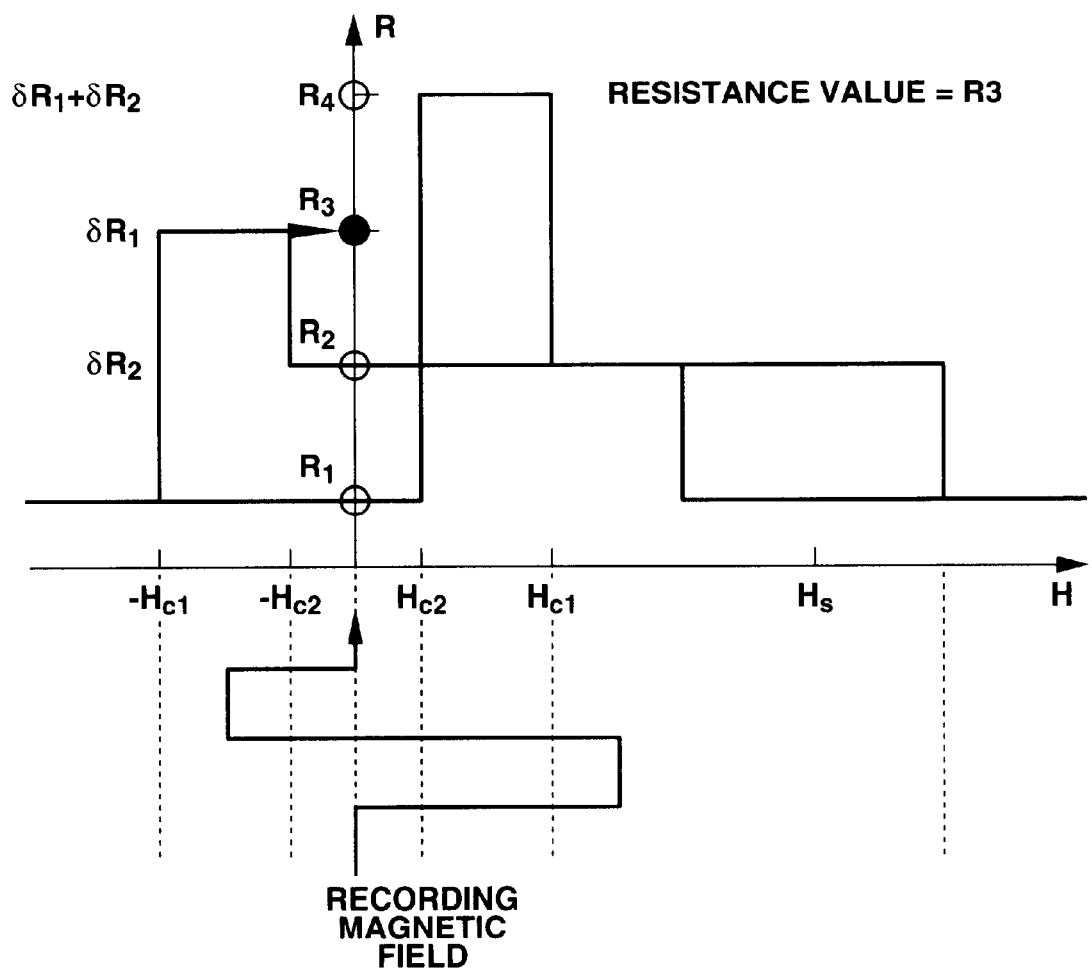
FIG. 14 is a schematic view showing a recording magnetic field for recording R3 in case where $Hc1>Hc2$ and $\delta R1>\delta R2$ exist.

In the implementation shown in FIG. 14 the applied magnetic field (or predefined recording magnetic field pattern) is changed from 0 to Hc1+α to −(Hc2+α) (>−Hc1) to 0, and the resistance value becomes R3.

Figure 16:
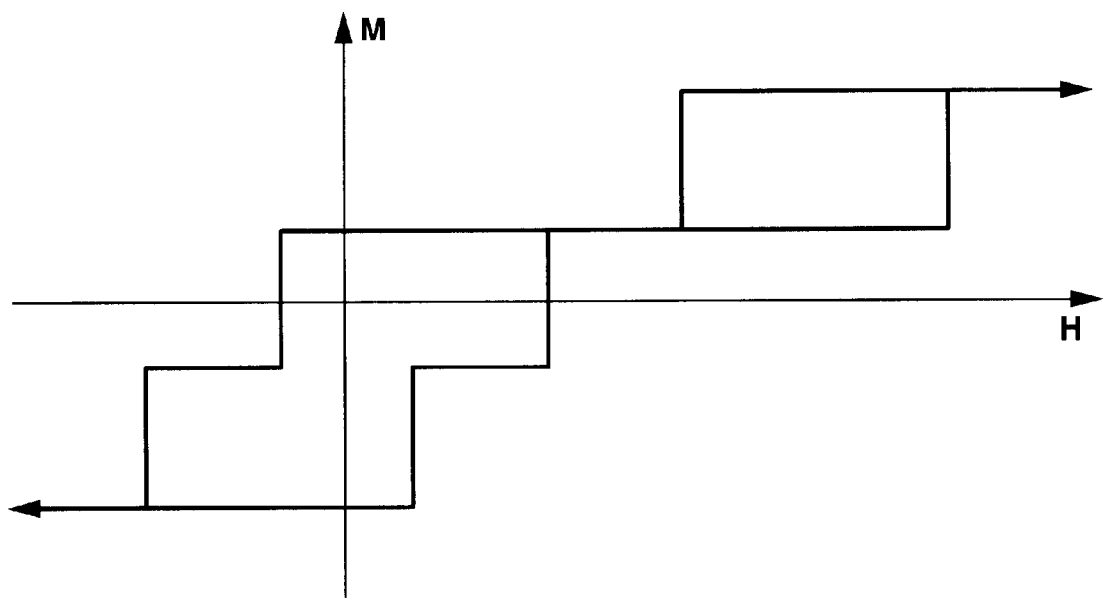
FIG. 16 is a schematic view showing a magnetization curve in case where $Hc1<Hc2$ and $\delta R1<\delta R2$ exist.

FIG. 15 schematically shows another model of the magnetic resistance curve of another embodiment of a magnetic resistance element embodying aspects of the present invention where Hc1<Hc2 and δR1<δR2. Likewise, a model of the magnetization curve this embodiment is schematically shown in FIG. 16.

Also, in this embodiment, if the magnetic field is set to −Hc2 or less, the magnetization directions of three layers are oriented and aligned in the leftward direction, like in the previous case. In this case, the resistance (i.e., the combined resistance of the magnetic resistance element) is R1.

Next, when the magnetic field is gradually changed in the positive direction and the magnitude of the external magnetic field becomes Hc1, the magnetization of the intermediate layer 1 is inverted, and the resistance is increased by δR1 to become R2 (=R1+δR1).

If the magnetic field is further changed to the positive side, the direction of the magnetization of the intermediate magnetic layer 2 is also inverted, and the resistance becomes R3 (=R1+δR2).

If the magnetic field is further changed to the positive side to become Hs+Hc3 or more, the magnetization arrays are all aligned in the rightward direction, and return to R1 again.

If the magnetic field is changed to the negative side from this state, the direction of magnetization of the upper magnetic layer 3 is inverted at Hs −Hc3 and the resistance value becomes R3. If the magnetic field is further changed to become −Hc1, the direction of magnetization of the intermediate magnetic layer 2 is inverted and the resistance becomes R4 (=R1+δR1+δR2).

If the magnetic field exceeds −Hc2, all the magnetization directions are aligned in the leftward direction, as in the initial state, and the resistance becomes R1.

In the element (in the case 3) which shows this magnetic resistance change, four kinds of resistance values are indicated in the state where the magnetic field is zero, by performing recording as shown in FIGS. 17 to 20.

Figure 17:
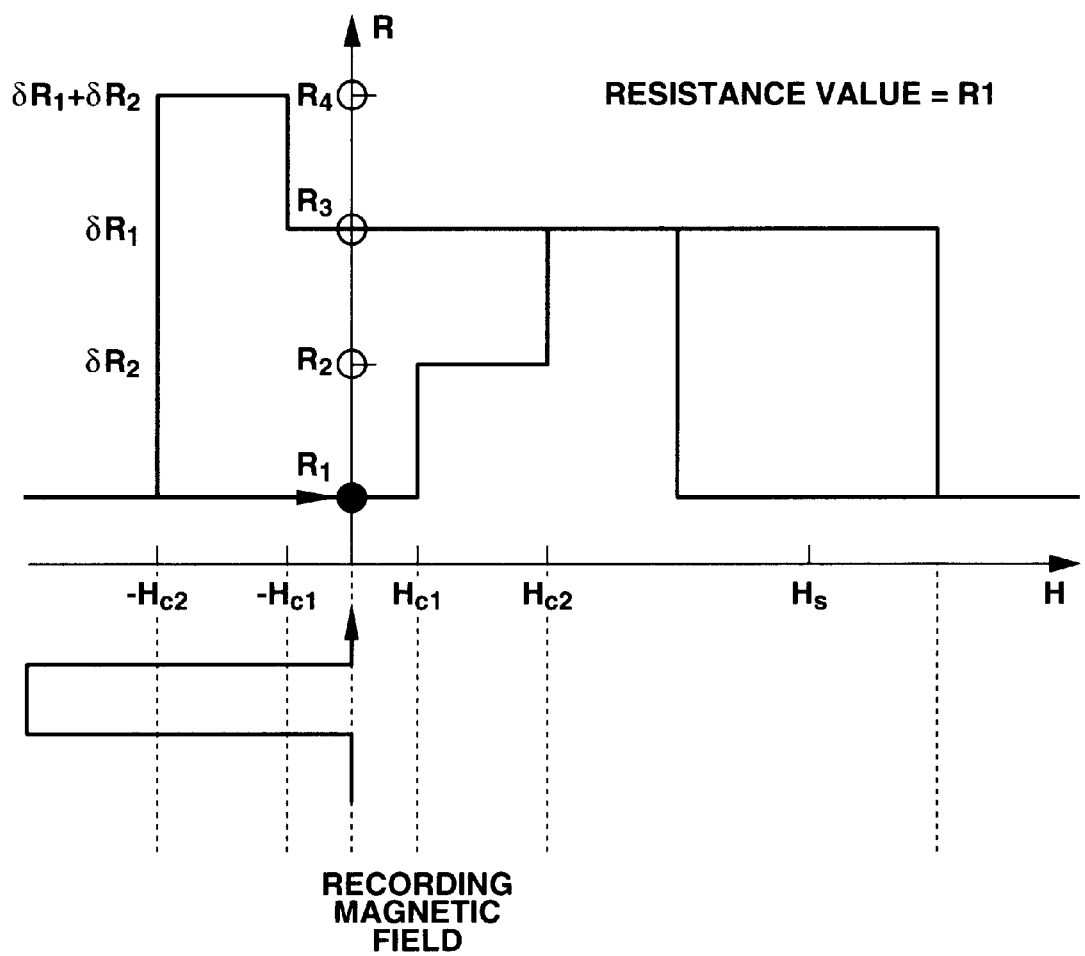
FIG. 17 is a schematic view showing a recording magnetic field for recording R1 in case where $Hc1<Hc2$ and $\delta R1<\delta R2$ exist.

In the implementation shown in FIG. 17 the applied magnetic field (or predefined recording magnetic field pattern) is changed from 0 to $-(Hc2+\alpha)$ to 0. In this case, the magnetization directions of the lower magnetic layer 1, the intermediate magnetic layer 2, and the upper magnetic layer 3 are aligned in the leftward direction, and the resistance value becomes R1.

Figure 18:
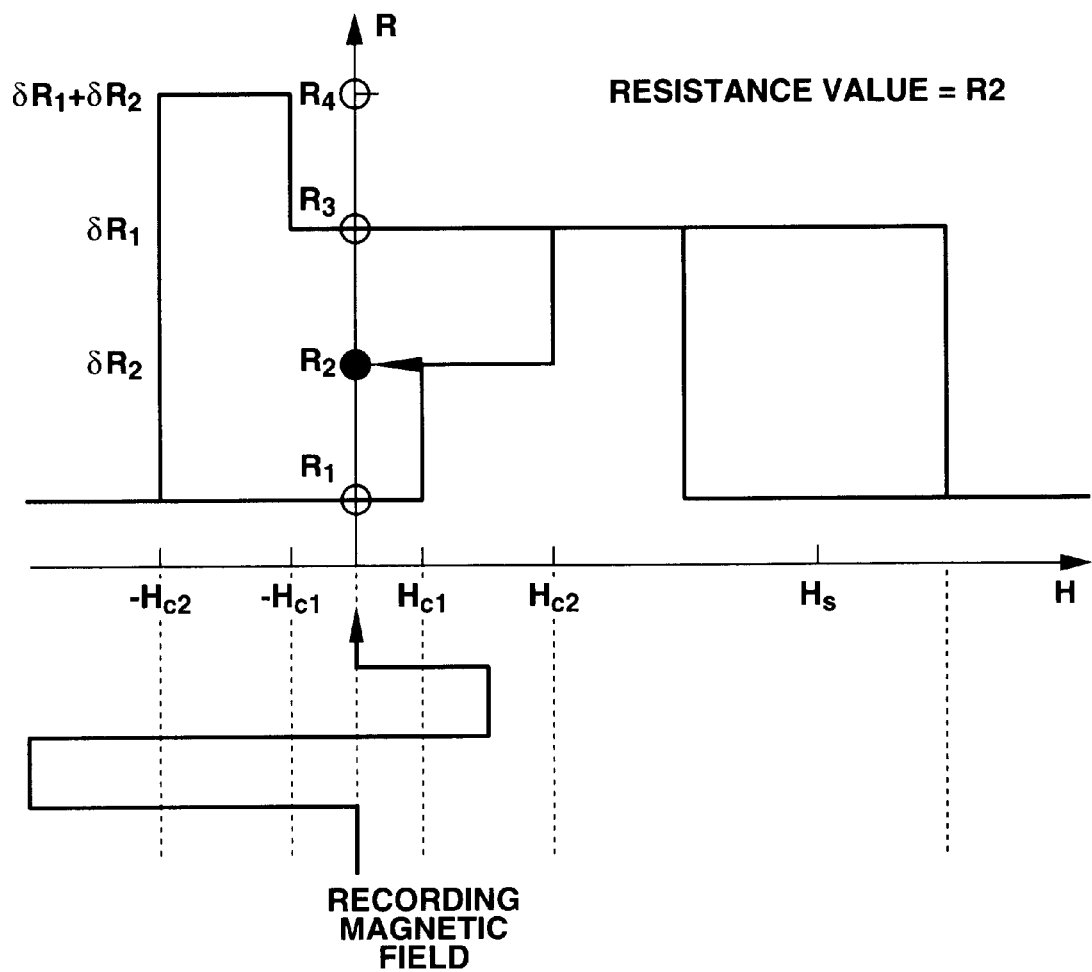
FIG. 18 is a schematic view showing a recording magnetic field for recording R2 in case where $Hc1<Hc2$ and $\delta R1<\delta R2$ exist.

In the implementation shown in FIG. 18 the applied magnetic field (or predefined recording magnetic field pattern) is changed from 0 to $-(Hc2+\alpha)$ to $Hc1+\alpha(<Hc2)$ to 0, and the resistance value becomes R2.

Figure 19:
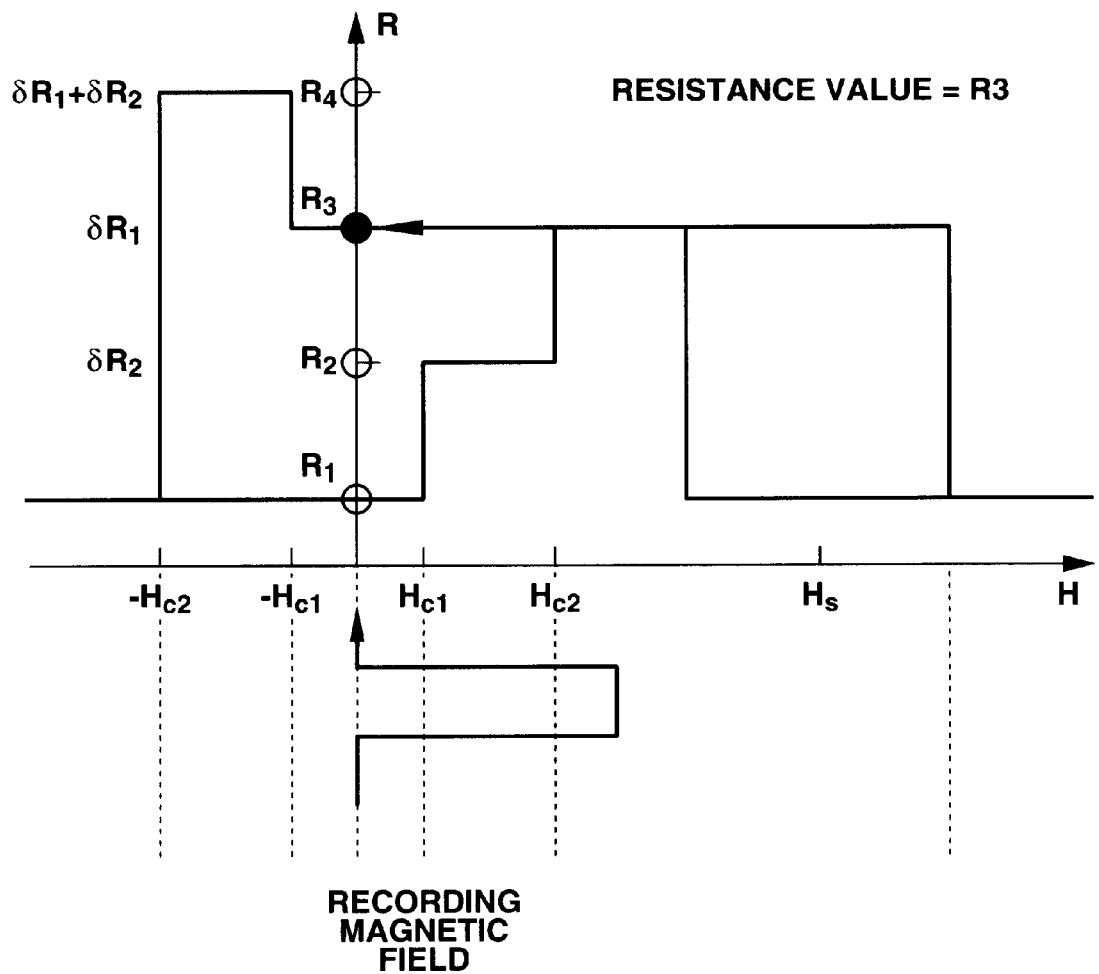
FIG. 19 is a schematic view showing a recording magnetic field for recording R3 in case where Hc1<Hc2 and δR1<δR2 exist.

In the implementation shown in FIG. 19 the applied magnetic field (or predefined recording magnetic field pattern) is changed from 0 to $Hc2+\alpha$ to 0, and the resistance value becomes R3.

Figure 20:
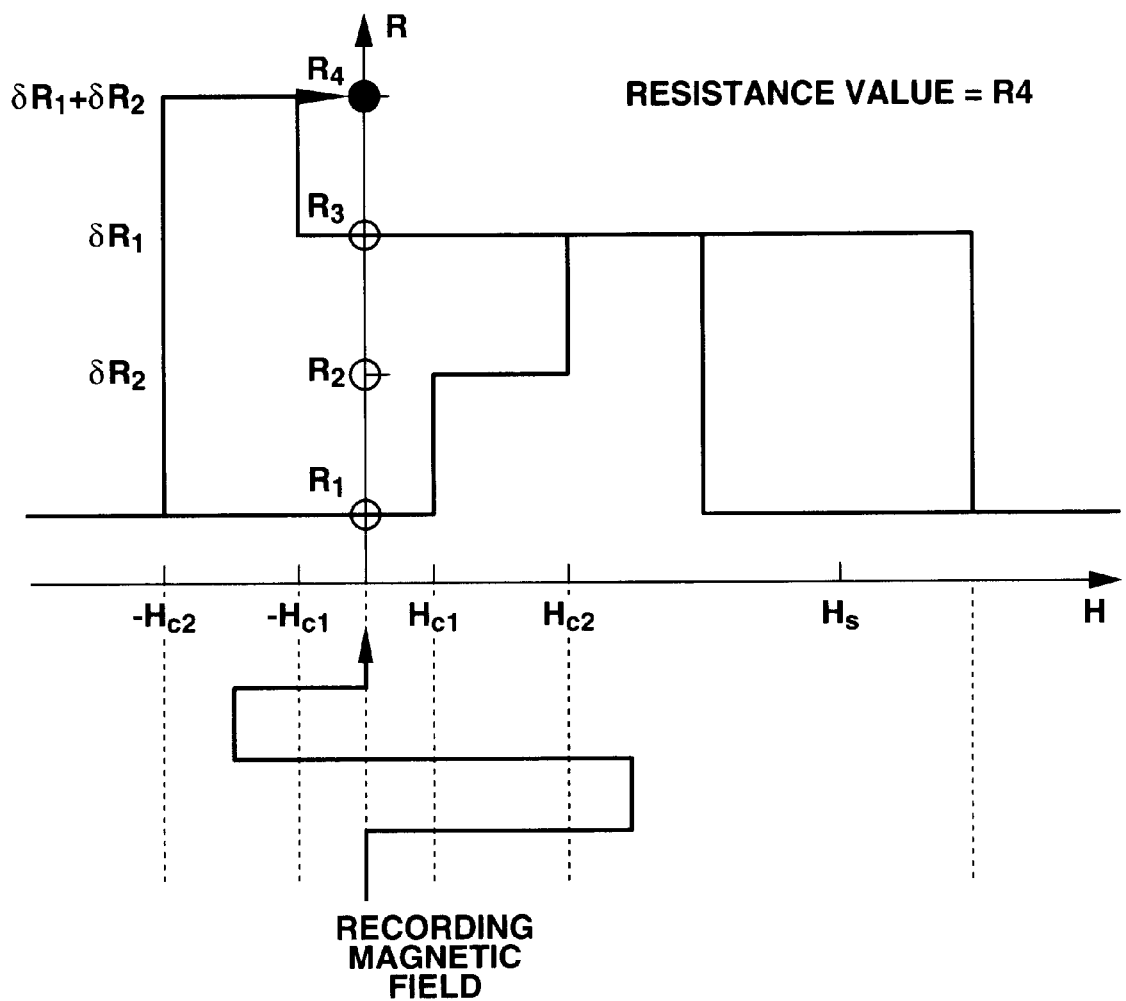
FIG. 20 is a schematic view showing a recording magnetic field for recording R4 in case where Hc1<Hc2 and δR1<δR2 exist.

In the implementation shown in FIG. 20 the applied magnetic field (or predefined recording magnetic field pattern) is changed from 0 to $Hc2+\alpha$ to $-(Hc1+\alpha)$ ($>-Hc2$) to 0, and the resistance value becomes R4.

Figure 22:
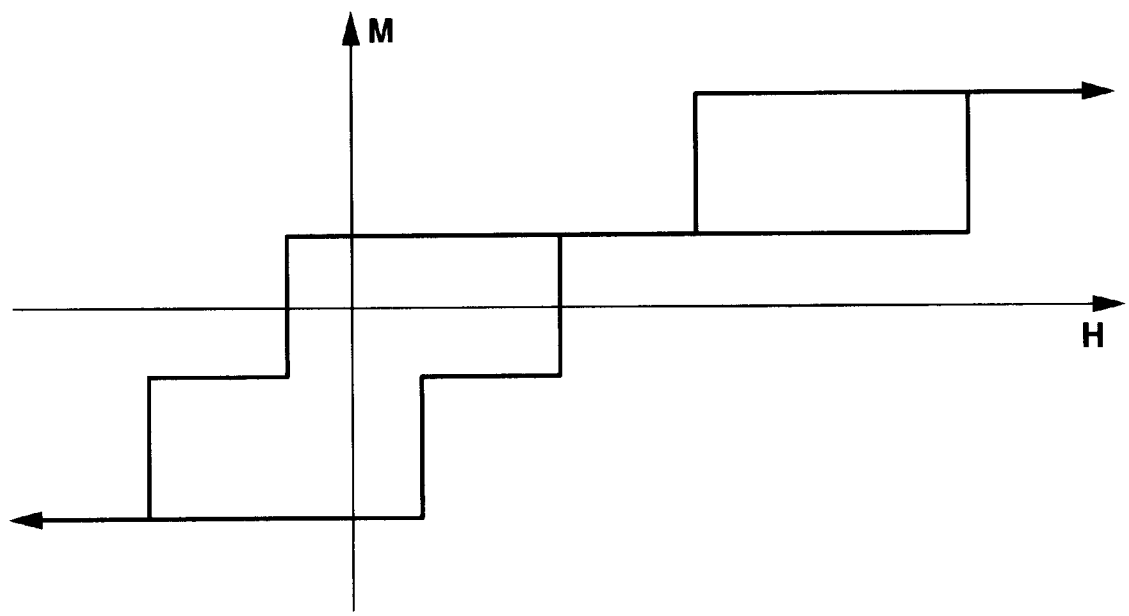
FIG. 22 is a schematic view showing a magnetization curve in case where Hc1<Hc2 and δR1<δR2 exist.

Finally, FIG. 21 schematically shows another model of a magnetic resistance curve of another embodiment of a magnetic resistance element embodying aspects of the present invention where Hc1>Hc2 and $\delta R1<\delta R2$. Likewise, FIG. 22 schematically shows a model of the magnetization curve in corresponding to this embodiment.

As shown in FIG. 21, if the magnetic field is set to $-Hc1$ or less, the magnetization directions of three layers are all aligned in the leftward direction, like in the previous embodiments. In this case, the resistance is R1.

Next, if the magnetic field is changed in the positive direction, the magnetization of the intermediate magnetic layer 2 is inverted when the magnitude of the external magnetic field becomes Hc2, and the resistance is increased by $\delta R1+\delta R2$ to become R4 ($=R1+\delta R1+\delta R2$).

If the magnetic field is further changed to the positive side to become Hc1, the direction of the magnetization of the intermediate magnetic layer 1 is also inverted, and the resistance becomes R3 ($=R1+\delta R2$).

If the magnetic field is further changed to the positive side to become Hs+Hc3 or more, the magnetization arrays are all aligned in the rightward direction, and return to R1 again.

If the magnetic field is changed to the negative side from this state, the direction of magnetization of the upper magnetic layer 3 is inverted at Hs–Hc3 and the resistance value becomes R3. If the magnetic field is further changed to become $-Hc2$, the direction of magnetization of the intermediate magnetic layer 2 is inverted and the resistance becomes R2 ($=R1+\delta R1$).

If the magnetic field exceeds $-Hc1$, all the magnetization arrays are aligned in the leftward direction, as in the initial state, and the resistance becomes R1.

In the element (in the case 4 shown in FIG. 21) which embodies this magnetic resistance change, four kinds of resistance values are indicated in the state where the magnetic field is zero The combined resistance of the magnetic resistance element may be changed to a respective one of the four kinds of resistance values by generating the predefined recording magnetic field patterns as shown in FIGS. 23 to 26.

Figure 23:
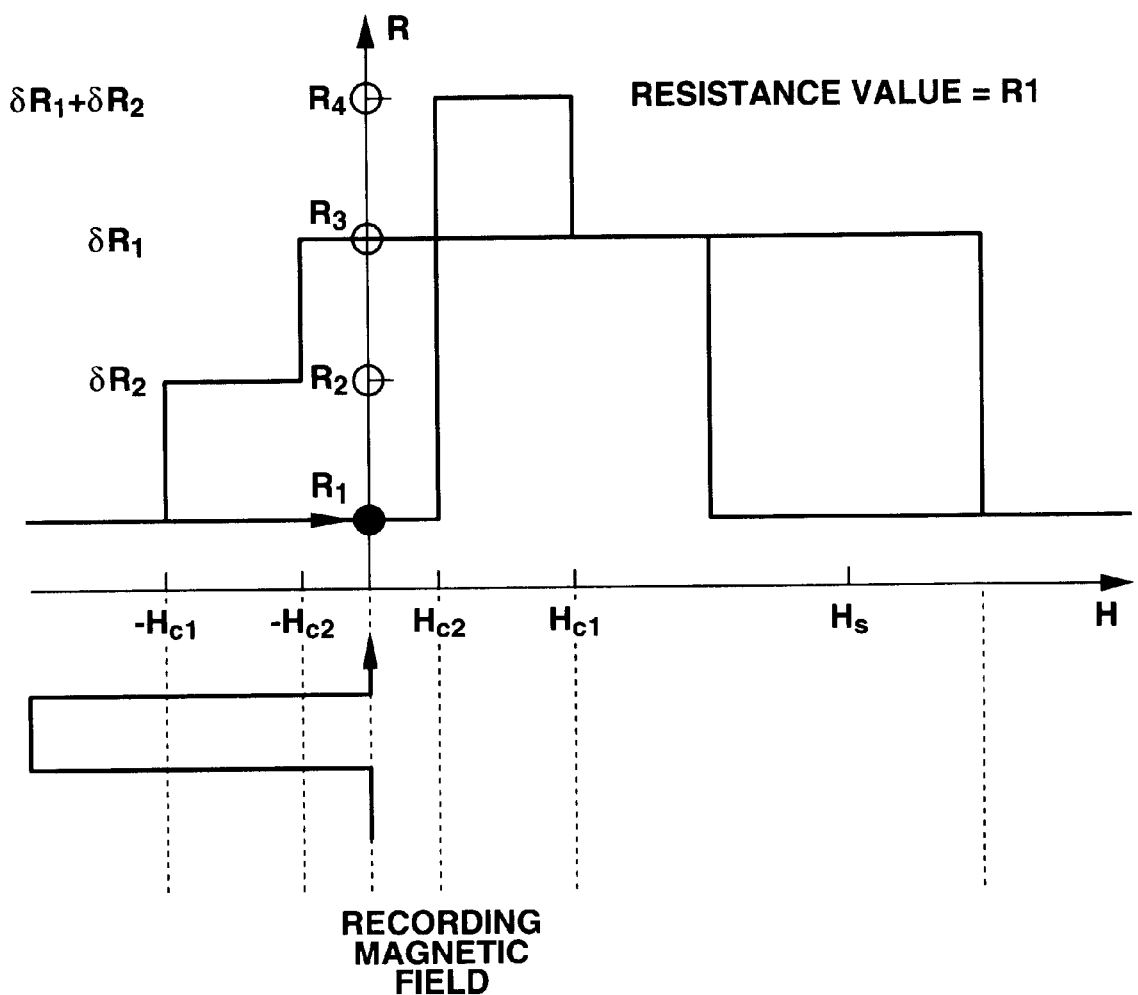
FIG. 23 is a schematic view showing a recording magnetic field for recording R1 in case where Hc1<Hc2 and δR1<δR2 exist.

In the implementation shown in FIG. 23 the applied magnetic field is changed from 0 to $-(Hc1+\alpha)$ to 0. In this case, the magnetization directions of the lower magnetic layer 1, the intermediate magnetic layer 2, and the upper magnetic layer 3 are aligned in the leftward direction, and the resistance value becomes R1.

Figure 24:
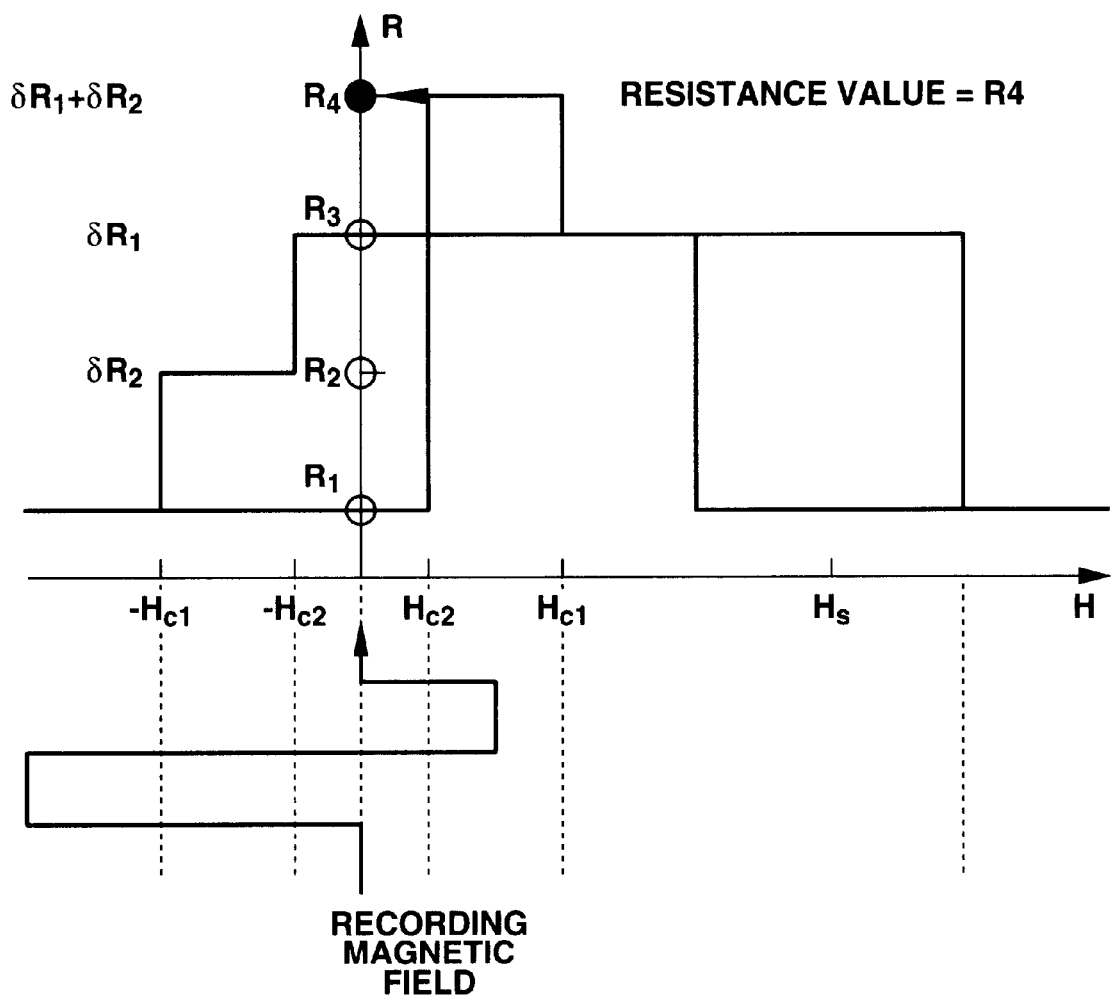
FIG. 24 is a schematic view showing a recording magnetic field for recording R4 in case where Hc1<Hc2 and δR1<δR2 exist.

In the implementation shown in FIG. 24 the applied magnetic field (or predefined recording magnetic field pattern) is changed from 0 to $-(Hc1+\alpha)$ to $Hc2+\alpha(<Hc1)$ to 0, and the resistance value becomes R4.

Figure 25:
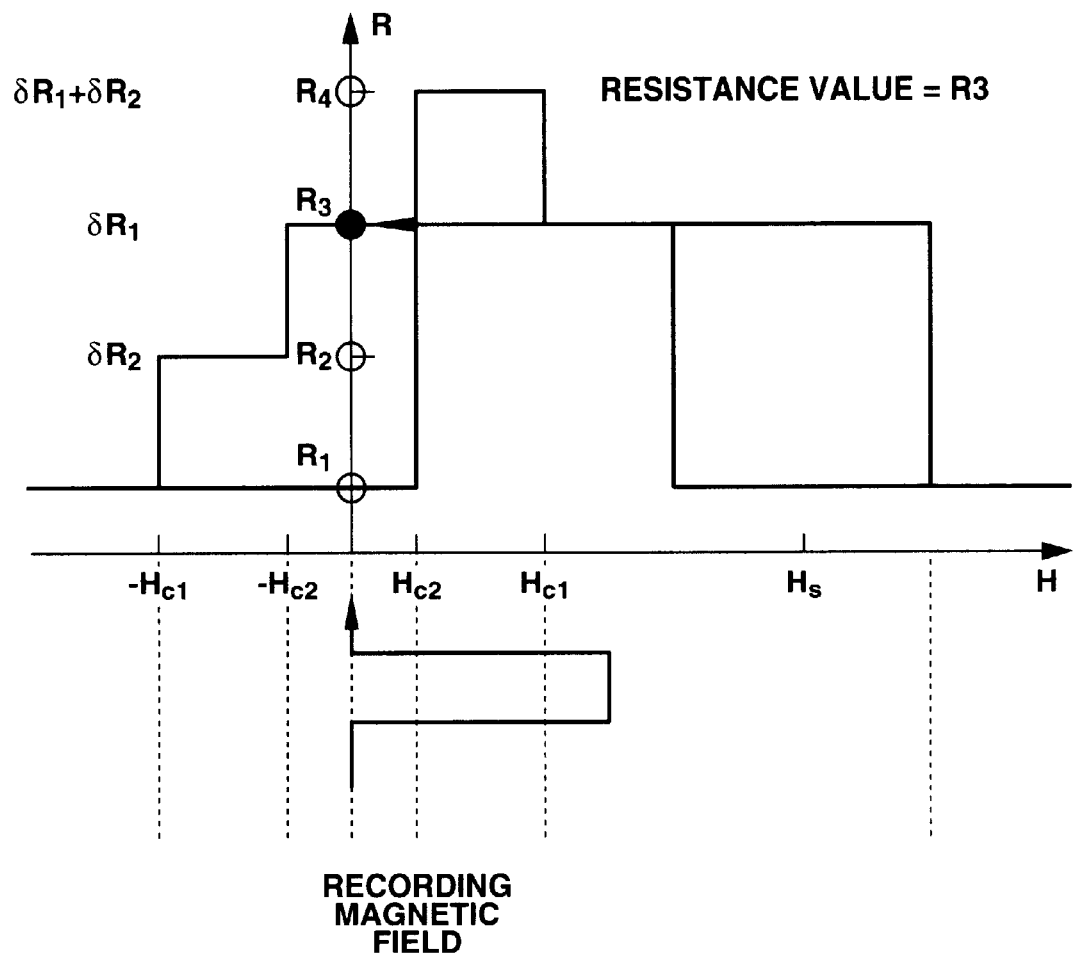
FIG. 25 is a schematic view showing a recording magnetic field for recording R3 in case where Hc1<Hc2 and δR1<δR2 exist.

In the implementation shown in FIG. 25 the applied magnetic field (or predefined recording magnetic field pattern) is changed from 0 to $Hc1+\alpha$ to 0, and the resistance value becomes R3.

Figure 26:
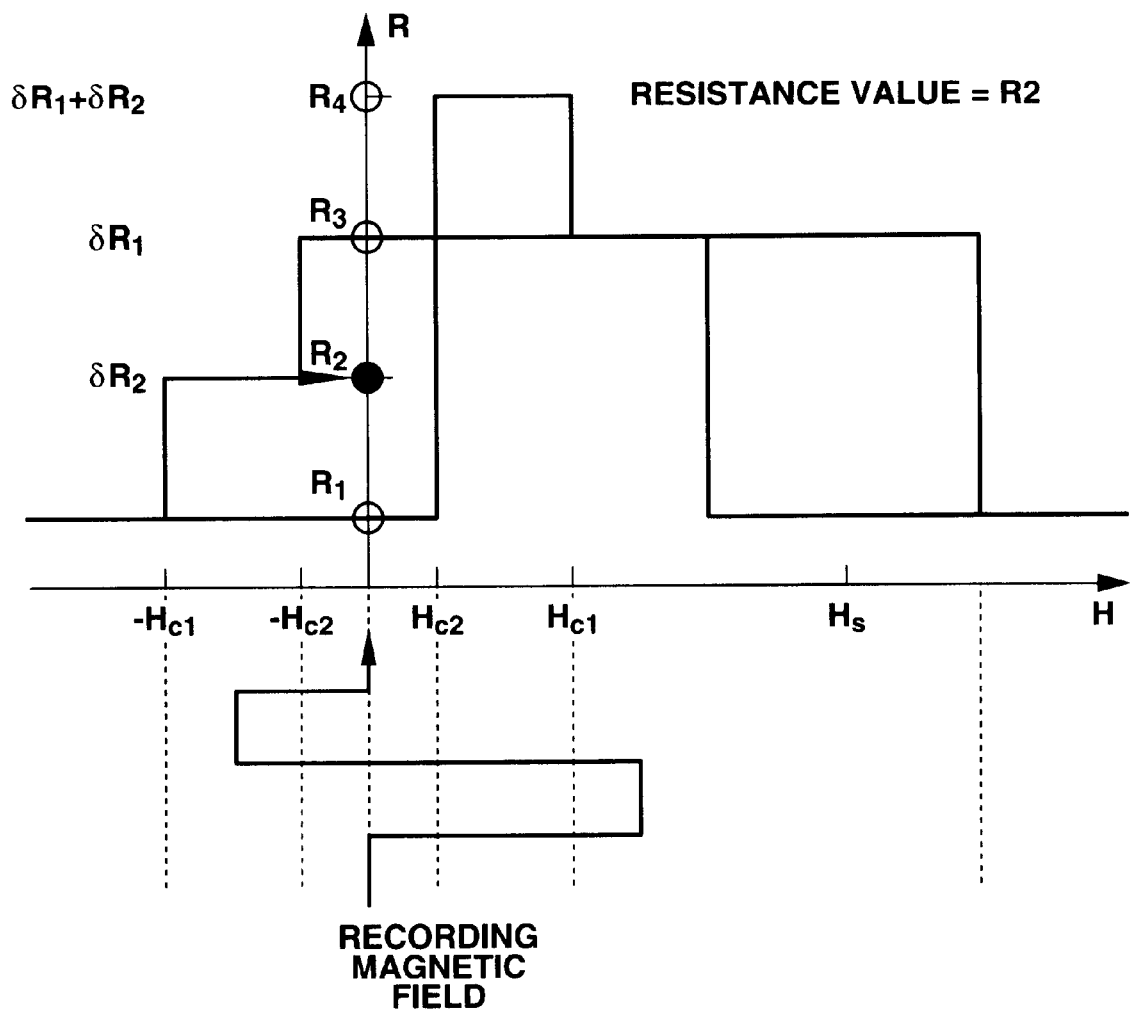
FIG. 26 is a schematic view showing a recording magnetic field for recording R2 in case where Hc1<Hc2 and δR1<δR2 exist.

In the implementation shown in FIG. 26 the applied magnetic field (or predefined recording magnetic field pattern) is changed from 0 to $Hc1+\alpha$ to $-(Hc2+\alpha)$ ($>-Hc1$) to 0, and the resistance value becomes R2.

Explained next will be an example in which the magnetic resistance element according to the present invention is applied to a magnetic memory.

Figure 27:
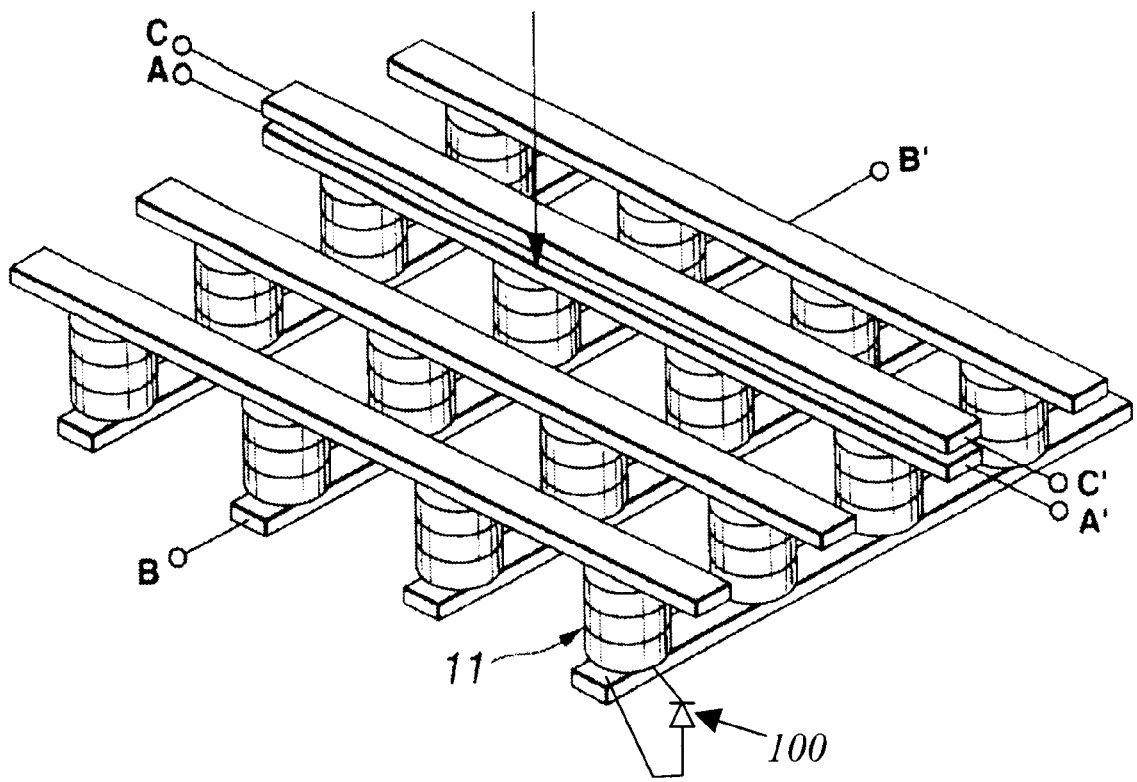
FIG. 27 is a perspective view schematically showing a structure example of a magnetic memory using a magnetic resistance element of the present invention.
Figure 28:
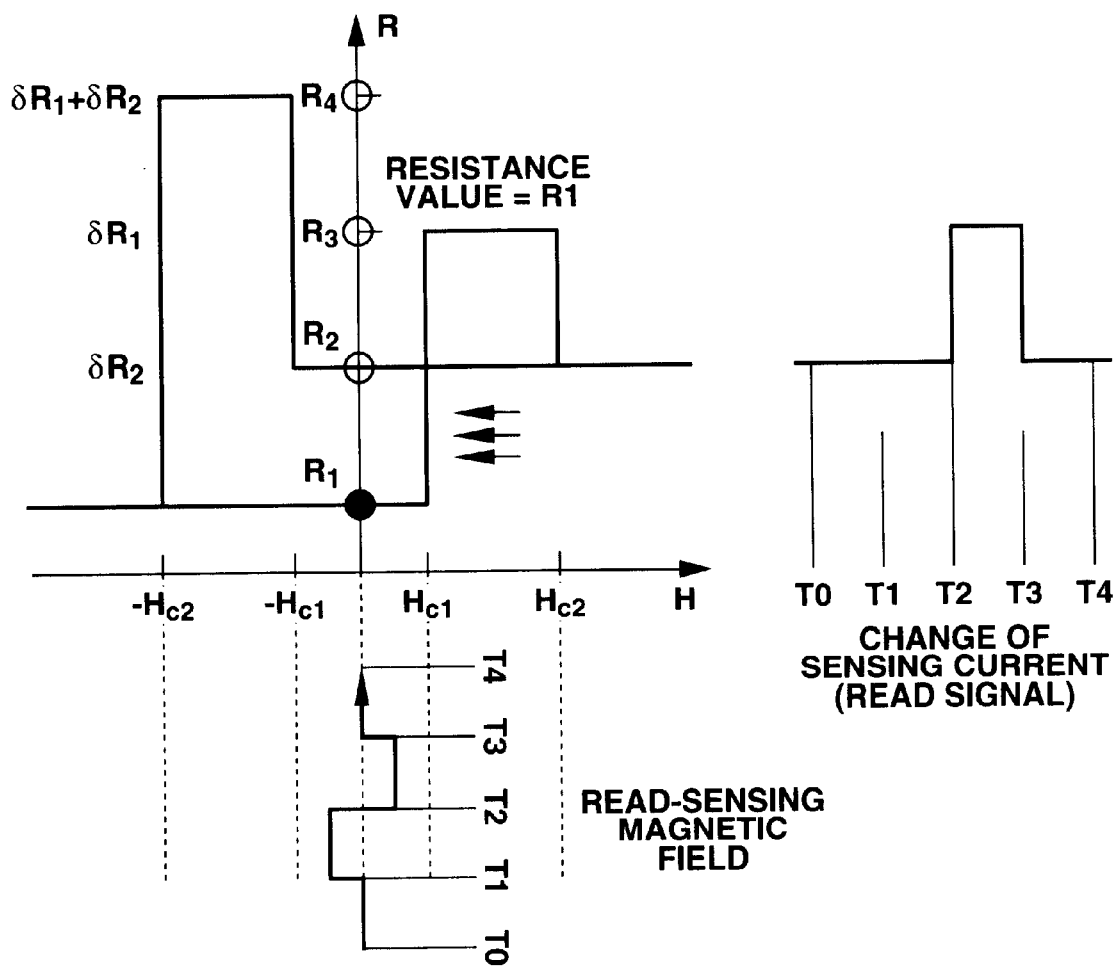
FIG. 28 is a characteristic graph showing a read-sensing magnetic field and a sensing current magnetic field change in the case of the resistance value R1 in the magnetic memory shown in FIG. 27.
Figure 29:
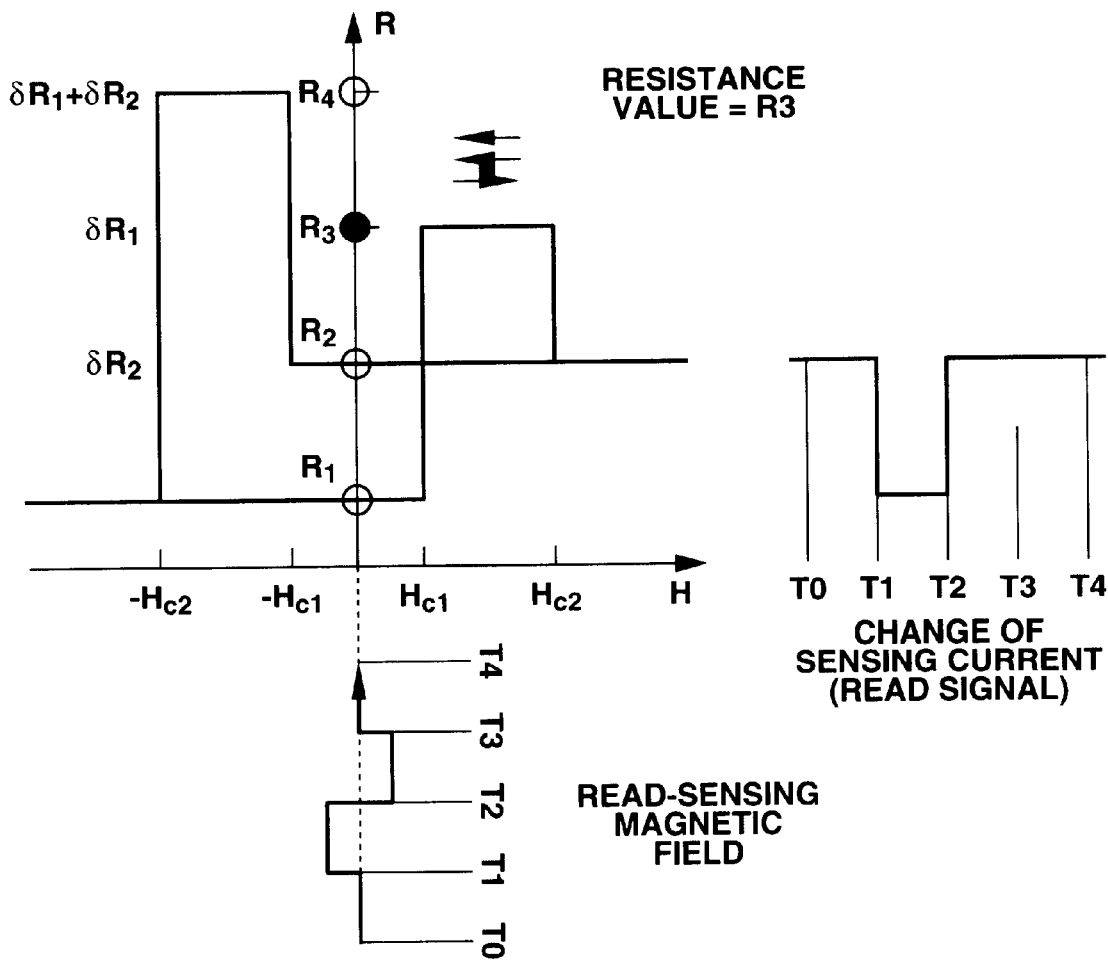
FIG. 29 is a characteristic graph showing a read-sensing magnetic field and a sensing current magnetic field change in the case of the resistance value R2 in the magnetic memory shown in FIG. 27.
Figure 30:
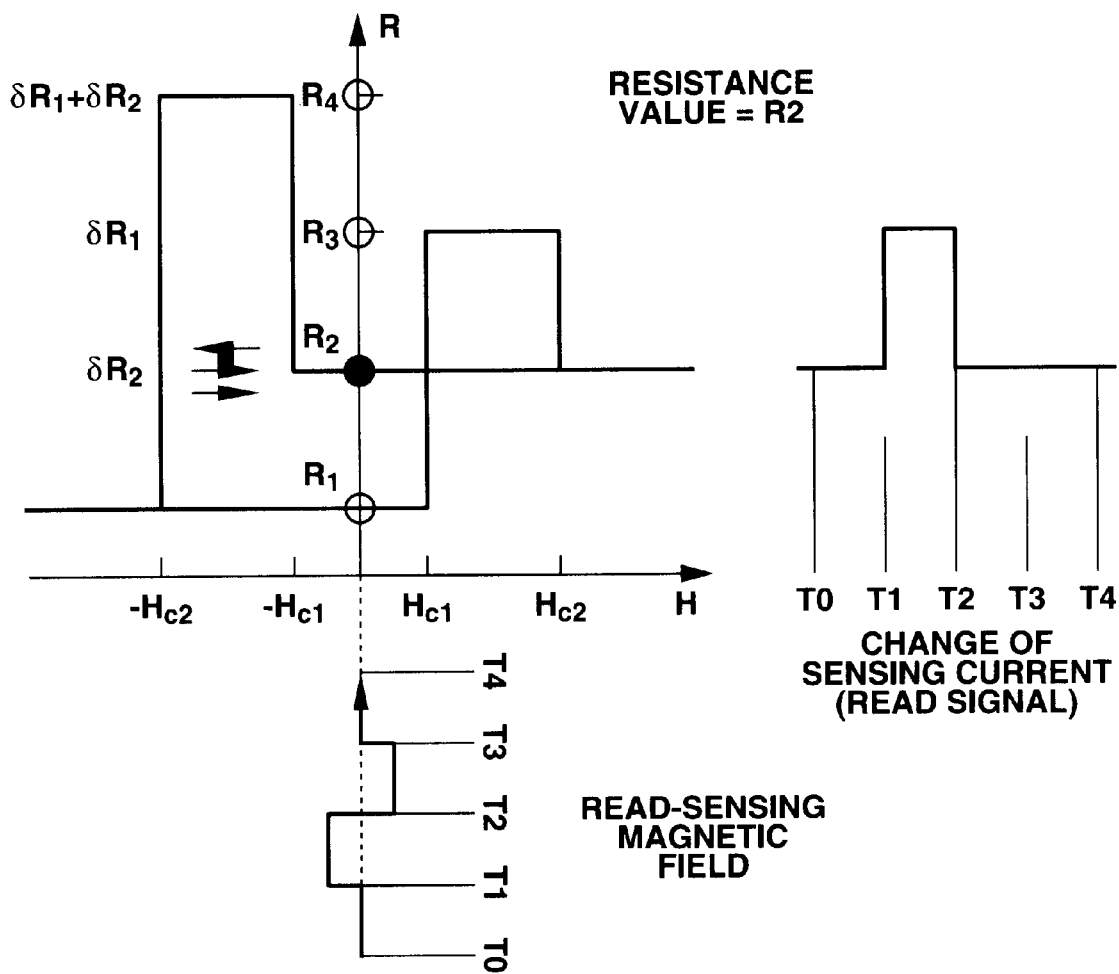
FIG. 30 is a characteristic graph showing a read-sensing magnetic field and a sensing current magnetic field change in the case of the resistance value R3 in the magnetic memory shown in FIG. 27.
Figure 31:
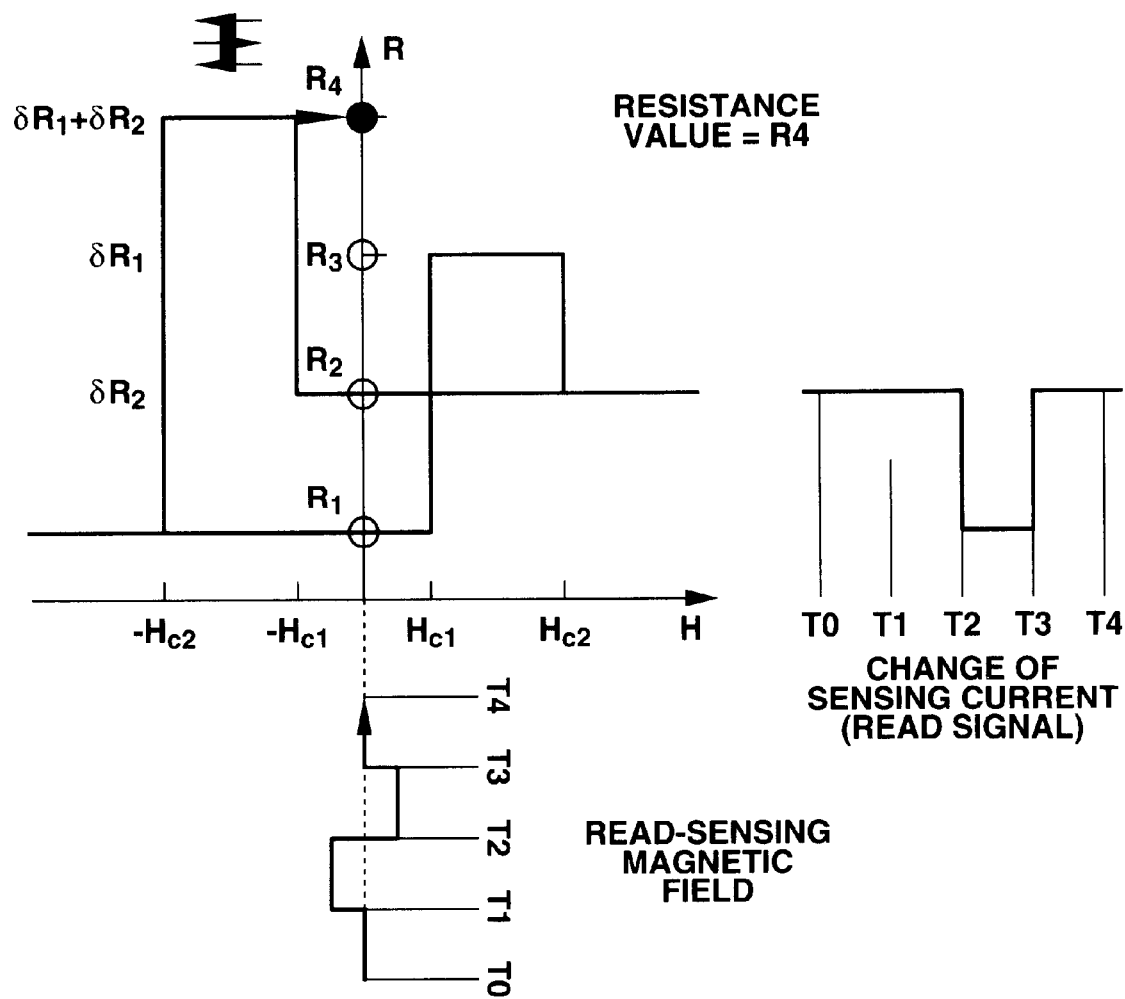
FIG. 31 is a characteristic graph showing a read-sensing magnetic field and a sensing current magnetic field change in the case of the resistance value R4 in the magnetic memory shown in FIG. 27.

FIG. 27 shows a structural example of such a magnetic memory, and its magnetic resistance element 11 is inserted between the electrode A–A' and the electrode B–B' perpendicular to each other. The electrodes A–A' and B–B' construct an XY-matrix, and an electrode C–C' is provide in parallel with the electrode A–A'.

As shown in FIG. 27, a diode 100 (depicted schematically) is inserted between the magnetic resistance element and any of the upper and lower electrodes, so that the current flows only in one direction. By adopting this structure, the current flows only through an addressed magnetic resistance element 11.

When information is written in this magnetic memory, a current signal is generated to flow through each of the electrodes A–A" and B–B,' which produces a synthetic or recording magnetic field pattern. The synthetic or recording magnetic field pattern may be used to generate any of four or more magnetization arrays (or corresponding predefined resistances—R1, R2, R3, or R4) as discussed above.

During reading, a low current signal is made to flow between the electrode A–A' and the electrode B–B'. Further, as shown in FIGS. 28 to 31, the low current signal which generates a smaller change of the magnetic field is made to flow through the electrode A–A' of the electrode C–C'.

In this case, a change of a read signal as shown in FIGS. 28 to 31 occurs in accordance with the state of the magnetization array, and the state of the magnetization array which is recorded information can be read out.

In this case, if the values of $\delta R1$ and $\delta R2$ are equal to each other, i.e., if the resistance values of R2 and R3 are equal to each other, the change of the read signal is as described above and is not influenced at all.

Also, in case where $\delta R1$ and $\delta R2$ are different from each other, the state of four kinds of magnetization arrays can be known by directly investigating the resistance between the electrode A–A' and the electrode B–B'. In this case, the electrode C–C' is not required.

As described above, according to the present invention, it is possible to realize a magnetic memory capable of recording/reading four states into/from one element.

Also, the present invention is not limited to a magnetic memory. When used for a reproducing magnetic head, the recording density can be improved by combining the present invention with a new demodulation/modulation system.

Further, the present invention can be used for other various magnetic devices.

At last, explanation will be made of a preparation example of a magnetic resistance element actually prepared.

In this preparation example, film formation was all carried out by a spattering method, and metal masks were used for forming electrodes.

Si (100) whose surface was 3000-oxidized was used for a substrate, and a film of a lower magnetic layer NiFe (190)/Co (40) was formed on the substrate.

Oxidized Al was used for the tunnel barrier wall layer, and a film of Al (13) was formed in a size enough to cover a contact portion. Thereafter, plasma oxidation was carried out in a chamber.

A film of Co (100) to become an intermediate magnetic layer was formed, and the film of Al (13) was formed in a size enough to cover the contact portion. Thereafter, plasma oxidation was carried out again in the chamber.

Films of Co (40)/NiFe (100)/FeMn (350)/Co (100) were formed thereon as an upper magnetic layer and an anti-ferromagnetic layer, to be opposed to the lower magnetic layer. As for film formation, a magnetic field of about 100 oersted was applied in parallel with the lengthwise direction.

The Ar pressure during film formation was set to 0.3 Pa in case of NiFe and Co, 0.2 Pa in case of Al, and 0.6 Pa in case of FeMn.

The contact area in this magnetic resistance element is $100 \times 100\ \mu m^2$.

Figure 32:
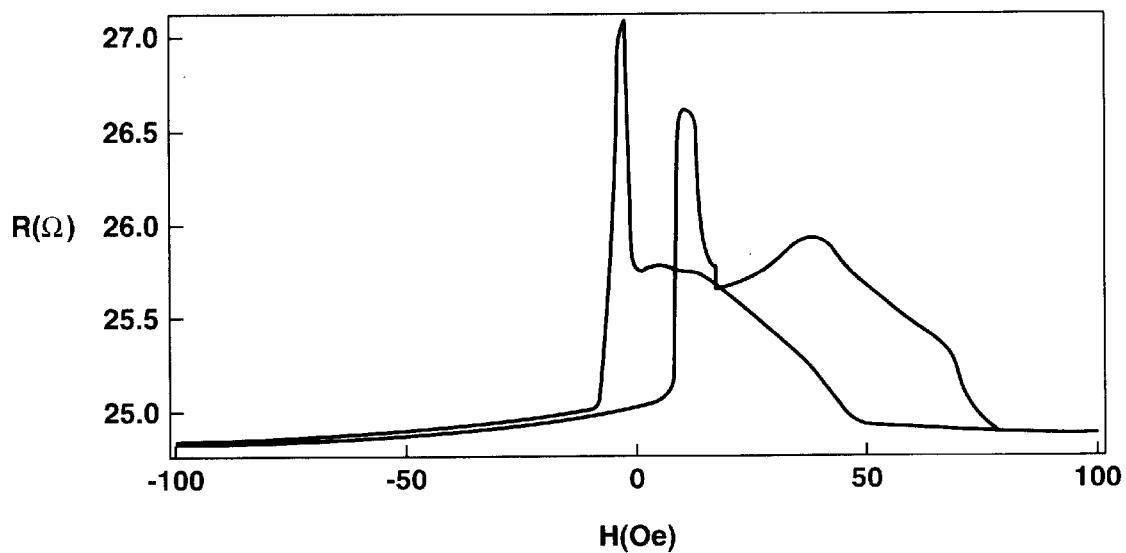
FIG. 32 is a characteristic graph showing a magnetic resistance curve of a magnetic resistance element actually prepared.

FIG. 32 shows a magnetic resistance curve (actually measured) of a magnetic element prepared as described above.

As is apparent from FIG. 32, the peaks of three kinds of resistance values can be observed clearly in the magnetic resistance element due to the magnetization arrays of the three magnetic layers.

What is claimed is:

1. A magnetic resistance element, comprising:
   an anti-ferromagnetic layer;
   an upper magnetic layer, which is formed in contact with the anti-ferromagnetic layer;
   an intermediate magnetic layer disposed below the upper magnetic layer;
   a lower magnetic layer disposed below the intermediate magnetic layer;
   a first tunnel barrier wall layer disposed between the lower magnetic layer and the intermediate layer;
   a second tunnel barrier wall layer disposed between the intermediate layer and the upper magnetic layers such that the magnetic resistance element has a combined resistance that corresponds to one of at least four predefined magnetic resistances; and
   means for generating a predefined recording magnetic field pattern to change the combined resistance to correspond to another of the at least four predefined magnetic resistances.

2. The magnetic resistance element according to claim 1, the lower magnetic layer has a first coercive force (Hc1) and the intermediate magnet layer has a second coercive force (Hc2) that is greater than the first coercive force, and the upper magnetic layer has a shift magnetic field (Hs) that is greater than the first and the second coercive forces of the lower and the intermediate magnetic layers.

3. The magnetic resistance element according to claim 2, wherein a first magnetic resistance change ($\delta R1$) caused at the first tunnel barrier wall layers between the lower magnetic layer and the intermdiate magnetic layer is greater than a second magnetic resistance change ($\delta R2$) caused at the second tunnel barrier wall layer between the intermediate magnetic layer and the upper magnetic layers.

4. The magnetic resistance element according to claim 3, wherein the at least four predefined magnetic resistances includes:
   a first resistance (R1) that is greater than 0 ohms;
   a second resistance (R2) that is approximately equal to $R1+\delta R2$;
   a third resistance (R3) that is approximately equal to $R1+\delta R1$; and
   a fourth resistance (R4) that is approximately equal to $R1+\delta R1+\delta R2$.

5. The magnetic resistance element according to claim 4, wherein the predefined recording magnetic field pattern changes from 0 to $-(Hc2+\alpha)$ to 0 Oersted to change the combined resistance to correspond to R1, where $\alpha$ is greater than 0 Oersted.

6. The magnetic resistance element according to claim 4, wherein the predefined recording magnetic field pattern changes from 0 to $(Hc2+\alpha)$ to 0 Oersted to change the combined resistance to correspond to R2, where $\alpha$ is greater than 0 Oersted and less than Hs Oersted.

7. The magnetic resistance element according to claim 4, wherein the predefined recording magnetic field pattern changes from 0 to $-(Hc2+\alpha)$ to $(Hc1+\alpha)$ to 0 Oersted to change the combined resistance to correspond to R3, where $\alpha$ is greater than 0 Oersted and $(Hc1+\alpha)$ is less than Hc2 Oersted.

8. The magnetic resistance element according to claim 4, wherein the predefined recording magnetic field pattern changes from 0 to $(Hc2+\alpha)$ to $-(Hc1+\alpha)$ to 0 Oersted to change the combined resistance to correspond to R4, where $\alpha$ is greater than 0 Oersted and $-(Hc1+\alpha)$ is greater than Hc2 Oersted.

9. The magnetic resistance element according to claim 2, wherein a first magnetic resistance change ($\delta R1$) caused at the first tunnel barrier wall layers between the lower magnetic layer and the intermediate magnetic layer is less than a second magnetic resistance change ($\delta R2$) caused at the second tunnel barrier wall layer between the intermediate magnetic layer and the upper magnetic layer.

10. The magnetic resistance element according to claim 9, wherein the at least four predefined magnetic resistances includes:
    a first resistance (R1) that is greater than 0 ohms;
    a second resistance (R2) that is approximately equal to $R1+\delta R1$;
    a third resistance (R3) that is approximately equal to $R1+\delta R2$; and
    a fourth resistance (R4) that is approximately equal to $R1+\delta R1+\delta R2$.

11. The magnetic resistance element according to claim 10, wherein the predefined recording magnetic field pattern changes from 0 to $-(Hc2+\alpha)$ to 0 Oersted to change the combined resistance to correspond to R1, where $\alpha$ is greater than 0 Oersted.

12. The magnetic resistance element according to claim 10, wherein the predefined recording magnetic field pattern changes from 0 to $-(Hc2+\alpha)$ to $(Hc1+\alpha)$ to 0 Oersted to change the combined resistance to correspond to R2, where $\alpha$ is greater than 0 Oersted and $(Hc1+\alpha)$ is less than Hc2 Oersted.

13. The magnetic resistance element according to claim 10, wherein the predefined recording magnetic field pattern changes from 0 to $(Hc2+\alpha)$ to 0 Oersted to change the combined resistance to correspond to R3, where $\alpha$ is greater than 0 Oersted and less than Hs Oersted.

14. The magnetic resistance element according to claim 10, wherein the predefined recording magnetic field pattern changes from 0 to (Hc2+α) to −(Hc1+α) to 0 Oersted to change the combined resistance to correspond to R4, where α is greater than 0 Oersted and −(Hc1+α) is greater than −Hc2 Oersted.

15. The magnetic resistance element according to claim 1, the lower magnetic layer has a first coercive force (Hc1) and the intermediate magnet layer has a second coercive force (Hc2) that is less than the first coercive force, and the upper magnetic layer has a shift magnetic field (Hs) that is greater than the first and the second coercive forces of the lower and the intermediate magnetic layers.

16. The magnetic resistance element according to claim 15, wherein a first magnetic resistance change (δR1) caused at the first tunnel barrier wall layers between the lower magnetic layer and the intermediate magnetic layer is greater than a second magnetic resistance change (δR2) caused at the second tunnel barrier wall layer between the intermediate magnetic layer and the upper magnetic layer.

17. The magnetic resistance element according to claim 16, wherein the at least four predefined magnetic resistances includes:
a first resistance (R1) that is greater than 0 ohms;
a second resistance (R2) that is approximately equal to R1+δR2;
a third resistance (R3) that is approximately equal to R1+δR1; and
a fourth resistance (R4) that is approximately equal to R1+δR1+δR2.

18. The magnetic resistance element according to claim 17, wherein the predefined recording magnetic field pattern changes from 0 to −(Hc1+α) to 0 Oersted to change the combined resistance to correspond to R1, where α is greater than 0 Oersted.

19. The magnetic resistance element according to claim 17, wherein the predefined recording magnetic field pattern changes from 0 to (Hc1+α) to 0 Oersted to change the combined resistance to correspond to R2, where α is greater than 0 Oersted and less than Hs Oersted.

20. The magnetic resistance element according to claim 17, wherein the predefined recording magnetic field pattern changes from 0 to (Hc1+α) to −(Hc2+α) to 0 Oersted to change the combined resistance to correspond to R3, where α is greater than 0 Oersted and −(Hc2+α) is greater than −Hc1 Oersted.

21. The magnetic resistance element according to claim 17, wherein the predefined recording magnetic field pattern changes from 0 to −(Hc1+α) to (Hc2+α) to 0 Oersted to change the combined resistance to correspond to R4, where α is greater than 0 Oersted and (Hc2+α) is less than Hc1 Oersted.

22. The magnetic resistance element according to claim 15, wherein a first magnetic resistance change (δR1) caused at the first tunnel barrier wall layers between the lower magnetic layer and the intermediate magnetic layer is less than a second magnetic resistance change (δR2) caused at the second tunnel barrier wall layer between the intermediate magnetic layer and the upper magnetic layer.

23. The magnetic resistance element according to claim 22, wherein the at least four predefined magnetic resistances includes:
a first resistance (R1) that is greater than 0 ohms;
a second resistance (R2) that is approximately equal to R1+δR1;
a third resistance (R3) that is approximately equal to R1+δR2; and
a fourth resistance (R4) that is approximately equal to R1+δR1+δR4.

24. The magnetic resistance element according to claim 23, wherein the predefined recording magnetic field pattern changes from 0 to −(Hc1+α) to 0 Oersted to change the combined resistance to correspond to R1, where α is greater than 0 Oersted.

25. The magnetic resistance element according to claim 23, wherein the predefined recording magnetic field pattern changes from 0 to (Hc1+α) to −(Hc2+α) to 0 Oersted to change the combined resistance to correspond to R2, where α is greater than 0 Oersted and −(Hc2+α) is greater than −Hc1 Oersted.

26. The magnetic resistance element according to claim 23, wherein the predefined recording magnetic field pattern changes from 0 to (Hc1+α) to 0 Oersted to change the combined resistance to correspond to R3, where α is greater than 0 Oersted and less than Hs Oersted.

27. The magnetic resistance element according to claim 23, wherein the predefined recording magnetic field pattern changes from 0 to −(Hc1+α) to (Hc2+α) to 0 Oersted to change the combined resistance to correspond to R4, where α is greater than 0 Oersted and (Hc2+α) is less than Hc1 Oersted.

28. The magnetic resistance element according to claim 1, further comprising:
a first electrode disposed on the lower magnetic layer;
a second electrode disposed on the anti-ferromagnetic layer; and
a means for causing a low current sensing signal to flow between the first and the second electrodes and for sensing a change to the low current signal, the change reflecting the combined resistance corresponding to one of the at least four predefined resistances.

29. A magnetic device comprising:
a magnetic resistance element including:
an anti-ferromagnetic layer;
an upper magnetic layer, which is formed in contact with the anti-ferromagnetic layer;
an intermediate magnetic layer disposed below the upper magnetic layer;
a lower magnetic layer disposed below the intermediate magnetic layer;
a first tunnel barrier wall layer disposed between the lower magnetic layer and the intermediate layer;
a second tunnel barrier wall layer disposed between the intermediate layer and the upper magnetic layer such that the magnetic resistance element has a combined resistance that corresponds to one of at least four predefined magnetic resistances; and
means for generating a predefined recording magnetic field pattern to change the combined resistance to correspond to another of the at least four predefined magnetic resistances.

30. The magnetic device according to claim 29, wherein the magnetic device is a magnetic memory.

31. The magnetic device according to claim 30, further comprising:
a first electrode disposed on the lower magnetic layer of the magnetic resistance element;
a second electrode disposed on the anti-ferromagnetic layer of the magnetic resistance element; and
a diode disposed between the magnetic resistance element and one of the first and the second electrodes.

* * * * *